United States Patent
Hashimoto et al.

(10) Patent No.: US 6,346,598 B1
(45) Date of Patent: Feb. 12, 2002

(54) THERMOSETTING LOW-DIELECTRIC RESIN COMPOSITION AND USE THEREOF

(75) Inventors: Takeshi Hashimoto; Masaharu Kobayashi; Takeshi Sato; Daisuke Orino, all of Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/433,281

(22) Filed: Nov. 3, 1999

(30) Foreign Application Priority Data

Nov. 6, 1998 (JP) ............................................. 10-331977
Nov. 6, 1998 (JP) ............................................. 10-331978
Nov. 6, 1998 (JP) ............................................. 10-331979
Nov. 6, 1998 (JP) ............................................. 10-331980

(51) Int. Cl.$^7$ ................................................ C08G 73/10
(52) U.S. Cl. ..................... 528/322; 525/464; 526/262; 526/347.1; 528/26; 528/310
(58) Field of Search ................................ 528/310, 322, 528/26; 525/464; 526/262, 347.1

(56) References Cited

U.S. PATENT DOCUMENTS 4,371,719 A * 2/1983 Zahir et al.

FOREIGN PATENT DOCUMENTS

JP 04-060132 A * 3/1996

* cited by examiner

*Primary Examiner*—Robert Dawson
*Assistant Examiner*—Marc S. Zimmer
(74) *Attorney, Agent, or Firm*—Wenderoth, Lind & Ponack, LLP

(57) ABSTRACT

A thermosetting low-dielectric resin composition which has a low dielectric constant and a low dielectric tangent for use in a printed circuit board and which has excellent adhesion to a metal and scatters almost no resin when used for forming a prepreg by punching or cutting, the composition comprising a component (a): siloxane-modified polyimide, component (b): a compound containing 2 methylallyl groups and having the following formula (1) or a compound containing 3 allyl groups or 3 methylallyl groups and having the following formula (1A), and component (c): a compound containing at least 2 maleimide groups, Formula (1)

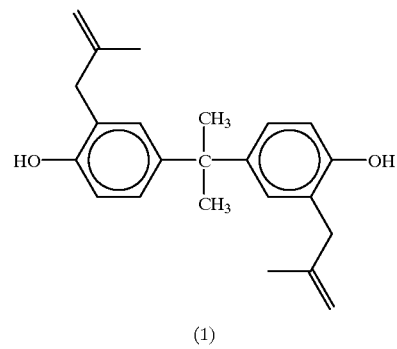

(1)

Formula (1A)

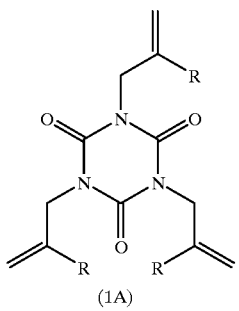

(1A)

wherein R is a hydrogen atom or methyl group.

11 Claims, No Drawings

THERMOSETTING LOW-DIELECTRIC RESIN COMPOSITION AND USE THEREOF

BACKGROUND OF THE INVENTION

1. Field of the Invention

The present invention relates to a thermosetting low-dielectric resin composition for print circuit board and its use. More specifically, it relates to a thermosetting low-dielectric resin composition which has a low dielectric constant and a low dielectric tangent and which shows excellent adhesion to metals and scatters almost no resin during working and also relates to a laminated board, a metal-clad laminated board and a circuit laminate material to which the above resin composition is applied.

2. Description of Prior Art

In recent years, remarkable increases are found in signal speeds and operation frequency of electronic systems. For electronic systems for use in a high-frequency region, it is desired to use a resin for a laminated board which has excellent heat resistance, a low dielectric constant and a low dielectric tangent and a laminated board or a metal-clad laminate obtained from prepregs using a resin having the above properties. A laminated board or a metal-clad laminate using a low-dielectric material enables higher-speed processing of signals since it can increase the propagation rate of electric signals.

It has been also proposed to use a fluorine resin and a polyphenylene ether resin which have low dielectric constants. However, these have a problem that they are poor in workability and adhesion and less reliable. For improving workability and adhesion, there has been proposed an epoxy-modified polyphenylene ether resin or a polyphenylene-ether-modified epoxy resin. Since, however, an epoxy resin has a high dielectric constant, satisfactory properties have not yet been obtained. There is known a curable resin composition prepared by mixing a polyphenylene ether resin, a polyfunctional cyanate ester resin and some other resin, adding a radical polymerization initiator and allowing the mixture to undergo a preliminary reaction (JP-A-57-185350), while the above resin composition is insufficient with regard to a decrease in dielectric constant.

Further, a polybutadiene resin containing a thermosetting 1,2-polybutadiene as a main component has a low dielectric constant, while it is poor in adhesion and is insufficient in heat resistance. There has been proposed a composition containing 100 parts by weight of a polyphenylene ether resin, 5 to 20 parts by weight of 1,2-polybutadiene resin, 5 to 10 parts by weight of a crosslinking monomer and a radical crosslinking agent (JP-A-61-83224). When 1,2-polybutadiene resin is used, however, sticking nature remains after a solvent is removed, and the practical problem is that a prepreg prepared by applying the above resin to a glass material or impregnating a glass material with it cannot maintain a tack-free state. When a 1,2-polybutadiene having a high molecular weight is used for removing the sticking nature, there is a problem that it has a low solubility in a solvent so that a solution has an increased viscosity and shows a decreased fluidity.

There has been proposed a low-dielectric laminated board or copper-clad laminate prepared by impregnating a fluorocarbon fiber fabric with a thermosetting resin (JP-B-2578097). In this case, however, it is required to surface-treat the fluorocarbon fiber for improving the adhesion between the fluorocarbon fiber and the thermosetting resin, and the laminated board or copper-clad laminate is very expensive since the fluorocarbon fiber is expensive, which results in difficulties in practical use.

A multi-layered printed circuit board for use in an electronic machine or device has an electric circuit on an inner layer as well. The multi-layered printed circuit board is fabricated by providing an inner circuit board on which a circuit is formed beforehand and copper foil(s) for outer-layer circuit(s), stacking the inner circuit board and the copper foil(s) through prepreg, shaping the resultant set under heat and pressure to prepare a multi-layered copper-clad laminate having an inner-layer circuit, and forming circuit(s) on outer layer(s). As the above prepreg, there is used a glass-cloth-substrate epoxy-resin prepreg. Since the signal speed and performance frequency of electronic machines and devices remarkably increase in recent years, thin circuit laminate materials having excellent heat resistance, a low dielectric constant and a low dielectric tangent are desired for micro-wiring in electronic machines and devices for use in a high-frequency region, particularly, electronic machines and devices which are required to be downsized and decreased in weight. With a thin circuit laminate material from a low-dielectric material, the propagation speed of electric signals can be increased, so that signals can be processed at a higher speed.

For a thin multi-layered printed circuit board, a thin glass-cloth-substrate epoxy-resin prepreg having a thickness of 30 to 100 $\mu$m is used at present. However, fiber lines are liable to appear, an uneven surface of an inner-layer circuit substrate cannot be absorbed within the prepreg, and an uneven surface is liable to be formed as a surface of an outer-layer, so that the smoothness of the surface is impaired, which is a bar against the formation of micro-wirings. There is therefore found a method in which the conventional glass-cloth-substrate epoxy-resin prepreg is replaced with a glass-cloth-free adhesive film as a prepreg, or a method in which a resin-applied copper foil prepared by stacking an adhesive layer on one surface of a copper foil for an outer-layer circuit beforehand is used as both a copper for an outer-layer circuit and a prepreg. The above adhesive film and the above resin-applied copper foil use a resin having film formability, and the resin that can be used is limited to those resin having film formability. When a resin having no film formability is used, the resin is liable to cause troubles such as breaking and chipping in the steps of transporting, cutting and laminating the adhesive film. Further, when the resin having no film formability is used as an insulating material for inter-layer connection of a multi-layered board, the inter-layer insulating layer is liable to extremely decreases in thickness in an inner-layer circuit presence portion during shaping of a multi-layered board under heat and pressure, or it is liable to cause troubles such as a decrease in inter-layer insulation resistance and a short circuit. As a resin having film formability, there have been proposed a thermoplastic polyimide adhesive film (U.S. Pat. No. 4,543,295), a high-molecular-weight epoxy resin (JP-A-4-120135), an acrylonitrile-butadiene copolymer/phenolic resin (JP-A-4-29393), a phenolic resin/butyral resin (JP-A-4-36366) and an acrylonitrile-butadiene copolymer/epoxy resin (JP-A-4-41581). However, these resin have a problem on dielectric constant properties, and they are not feasible for processing signals at a higher speed.

As a low-dielectric resin, there have been proposed a fluorine resin, a polyphenylene ether resin, a polybutadiene resin containing thermosetting 1,2-polybutadiene as a main component, and a composition containing 100 parts by weight of a polyphenylene ether resin, 5 to 20 parts by weight of 1,2-polybutadiene resin, 5 to 10 parts by weight of a crosslinking monomer and a radical crosslinking agent (JP-A-61-83224). However, these resin have difficulties in practical use since they are poor in heat resistance, workability and film formability.

SUMMARY OF THE INVENTION

It is an object of the present invention to provide a thermosetting resin composition which has a low dielectric constant and a low dielectric tangent for use in a printed circuit board and which has excellent adhesion to a metal and scatters almost no resin when a prepreg is prepared by punching or cutting.

It is another object of the present invention to provide a laminated board and a metal-clad laminate to which the above thermosetting resin composition is applied.

It is still another object of the present invention to provide an adhesive film of a thermosetting low-dielectric resin composition which has a low dielectric constant and a low dielectric tangent for use in a printed circuit board, which has excellent adhesion to a metal and scatters almost no resin when a prepreg is prepared by punching or cutting and which has film formability, or a metal foil to which the above thermosetting resin composition is applied, the adhesive film or the metal foil being a circuit laminate material.

According to the present invention, there is provided a thermosetting resin low-dielectric composition comprising a component (a): siloxane-modified polyimide, component (b): a compound containing 2 methylallyl groups and having the following formula (1) or a compound containing 3 allyl groups or 3 methylallyl groups and having the following formula (1A), and component (c): a compound containing at least 2 maleimide groups.

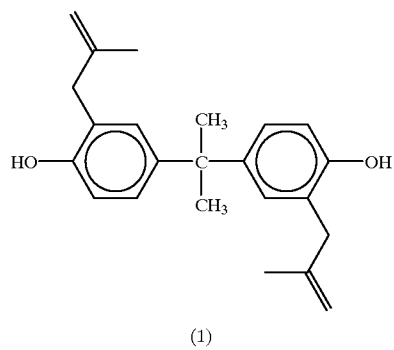

(1)

Formula (1)

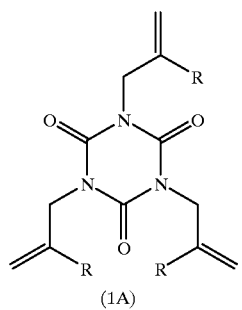

(1A)

Formula (1A)

wherein R is a hydrogen atom or methyl group.

According to the present invention, further, the above thermosetting low-dielectric resin composition includes an embodiment in which the total content of the components (b) and (c) per 100 parts by weight of the component (a) is 10 to 900 parts by weight and the content of methylallyl or allyl groups of the component (b) per mole equivalent of maleimide groups of the component (c) is 0.1 to 2.0 mol equivalent.

According to the present invention, further, the above thermosetting low-dielectric resin composition includes an embodiment in which the siloxane-modified polyimide as a component (a) contains 90 to 40 mol % of at least one of structural units of the following formula (2a) and 10 to 60 mol % of at least one of structural units of the following formula (2b) when the component (b) is the compound of the formula (1).

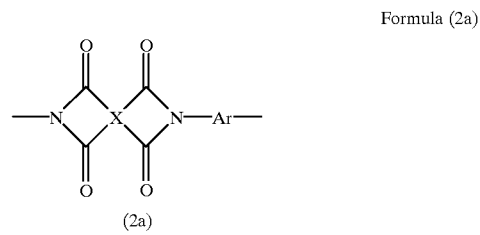

(2a)

Formula (2a)

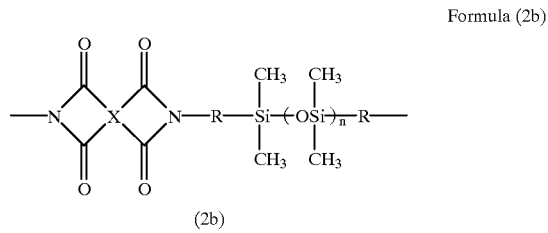

(2b)

Formula (2b)

wherein X is a tetravalent aromatic group and is any one of a 3,3',4,4'-diphenylsulfone structure, a 3,3',4,4'-biphenyl structure and 2,3',3,4'-biphenyl structure, Ar is a divalent group selected from aromatic-ring-possessing groups of the following formula (3), R is —$CH_2OC_6H_4$— whose methylene group is bonded to Si or an alkylene group having 1 to 10 carbon atoms, and n is an integer of 1 to 20,

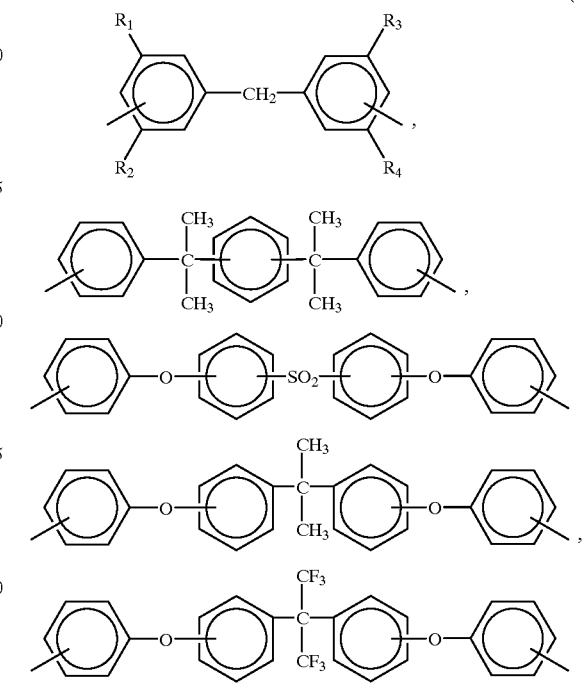

Formula (3)

wherein each of $R_1$, $R_2$, $R_3$ and $R_4$ is independently a hydrogen atom or an alkyl or alkoxy group having 1 to 4 carbon atoms provided that all of these are hydrogen atoms in no case.

According to the present invention, further, the above thermosetting low-dielectric resin composition includes an embodiment in which the siloxane-modified polyimide as a component (a) contains 90 to 40 mol % of at least one of structural units of the following formula (2a') and 10 to 60 mol % of structural units of the following formula (2b') when the component (b) has the formula (1A).

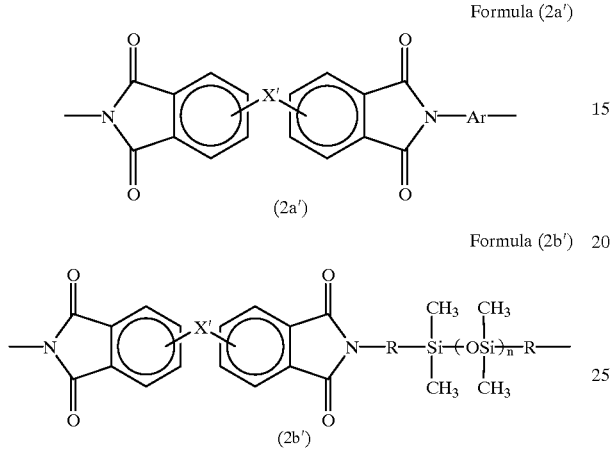

Formula (2a')

(2a')

Formula (2b')

(2b')

wherein X is a direct bond or any one of binding groups of —O—, —$SO_2$—, —CO—, —$C(CH_3)_2$—, —$C(CF_3)_2$— and —$COOCH_2CH_2OCO$—, Ar is a divalent group selected from aromatic-ring-possessing groups of the following formula (3A), R is —$CH_2OC_6H_4$— whose methylene group is bonded to Si or an alkylene group having 1 to 10 carbon atoms, and n is an integer of 1 to 20, Formula (3A)

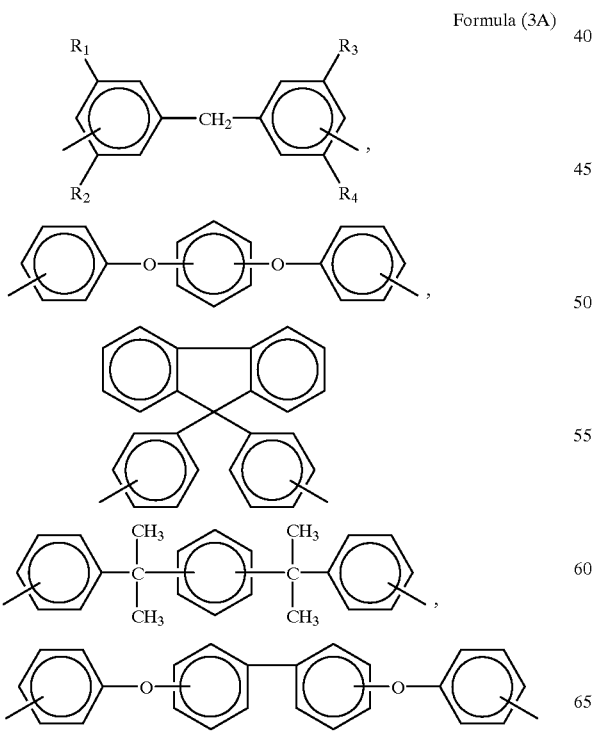

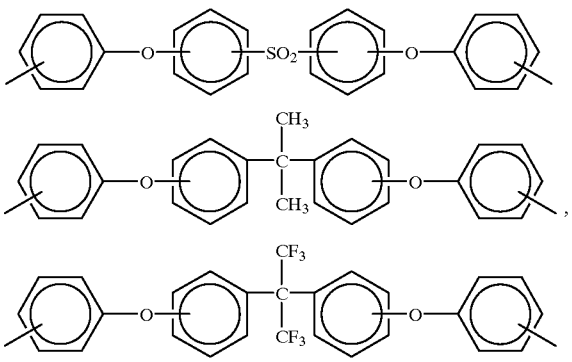

wherein each of $R_1$, $R_2$, $R_3$ and $R_4$ is independently a hydrogen atom or an alkyl or alkoxy group having 1 to 4 carbon atoms provided that all of these are hydrogen atoms in no case.

Further, according to the present invention, the above thermosetting low-dielectric resin composition includes an embodiment in which the siloxane-modified polyimide as a component (a) contains 90 to 40 mol % of at least one of structural units of the following formula (2a) and 10 to 60 mol % of structural units of the following formula (2b) when the component (b) has the formula (1A).

Formula (2a)

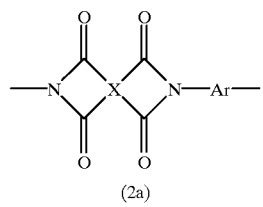

(2a)

Formula (2b)

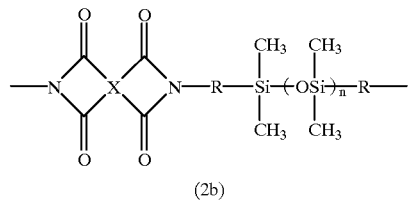

(2b)

wherein X is a tetravalent aromatic group and is any one of a 3,3',4,4'-diphenylsulfone structure, a 3,3',4,4'-biphenyl structure and 2,3',3,4'-biphenyl structure, Ar is a divalent group selected from aromatic-ring-possessing groups of the following formula (3A), R is —$CH_2OC_6H_4$— whose methylene group is bonded to Si or an alkylene group having 1 to 10 carbon atoms, and n is an integer of 1 to 20.

According to the present invention, further, there is provided a thermosetting low-dielectric resin composition which shows a dielectric constant of 3.2 or less after cured.

Further, according to the present invention, there is provided a laminated board comprising at least one prepreg sheet prepared by impregnating a reinforcing fiber material with the above thermosetting low-dielectric resin composition.

Further, according to the present invention, there is provided a metal-clad laminate comprising the above laminated board and a metal foil or foils which is or are stacked on and integrated with one surface or both surfaces of the laminated board. In the present invention, the metal-clad laminate is used in a state where the thermosetting low-dielectric resin composition is in a semi-cured state or a cured state as required depending upon use.

Further, according to the present invention, there is provided a circuit laminate material comprising either a peeling-off layer or a metal foil and the above thermosetting low-dielectric resin composition which is laminated on one surface of the peeling-off layer or the metal foil.

DETAILED DESCRIPTION OF THE INVENTION

The present invention will be explained in detail hereinafter.

First, the thermosetting low-dielectric resin composition of the present invention will be explained.

The thermosetting low-dielectric resin composition of the present invention comprises a component (a): siloxane-modified polyimide, a component (b): a compound containing at least 2 methylallyl groups and having the above formula (1) or a compound containing at least 3 allyl or methylallyl groups and having the above formula (1A) and a component (c): a compound containing 2 maleimide groups.

The amount ratio of the above components (a) to (c) is as follows. The total content of the components (b) and (c) per 100 parts by weight of the component (a) is 10 to 900 parts by weight, and the content of the allyl or methylallyl groups per mole equivalent of the maleimide groups of the component (c) is 0.1 to 2.0 mole equivalents.

When the siloxane-modified polyimide is used, the resin composition is improved in flexibility, the scattering of a resin during working is remarkably decreased, and the handling of the composition is eased when printed circuit boards are fabricated, so that the yield of the printed circuit boards is improved.

The siloxane-modified polyimide used in the present invention structurally contains siloxane, and the modification ratio of the polyimide with siloxane is 1 to 60 mol %. When the component (b) is a compound of the above formula (1), preferably, the siloxane-modified polyimide contains 90 to 40 mol % of at least one of structural units of the above formula (2a) and 10 to 60 mol % of at least one of structural units of the above formula (2b).

When the component (b) is a compound of the above formula (1A), preferably, the siloxane-modified polyimide used in the present invention 90 to 40 mol % of at least one structural units of the above formula (2a') and 10 to 60 mol % of at least one of structural units of the above formula (2b'). When the component (b) is a compound of the above formula (1), preferably, the siloxane-modified polyimide contains 90 to 40 mol % of at least one of structural units of the above formula (2a) and 10 to 60 mol % of at least one of structural units of the above formula (2b). Further preferably, the content of the structural units of the formula (2b) or (2b') is 10 to 40 mol %.

Preferably, the siloxane-modified polyimide has a weight average molecular weight of 5,000 to 500,000, a glass transition temperature of 150° C. or lower and a dielectric constant of 3.0 or lower. More preferably, the siloxane-modified polyimide has a weight average molecular weight of 5,000 to 300,000, a glass transition temperature of 140° C. or lower and a dielectric constant of 3.0 or lower. Still more preferably, the siloxane-modified polyimide has a weight average molecular weight of 10,000 to 300,000, a glass transition temperature of 130° C. or lower and a dielectric constant of 3.0 or lower. When the above weight average molecular weight is smaller than the above lower limit, undesirably, the resin composition shows poor thermal stability and consequently shows poor heat resistance. When the weight average molecular weight is larger than the above upper limit, undesirably, the melt viscosity of the resin composition increases so that the resin composition is poor in workability and adhesion. When the above glass transition temperature is higher than the above upper limit, undesirably, the melting temperature of the resin composition increases so that the working temperature is caused to increase or the adhesion is poor. When the above dielectric constant exceeds 3.0, undesirably, it is difficult to prepare the resin composition having a low dielectric constant.

In the present invention, the glass transition temperature refers to a temperature measured under the following conditions.

Conditions for measuring glass transition temperature ($T_g$)
Apparatus: apparatus for measuring modulus of elasticity in shear ("Rheo Stress RS75" produced by HAAKE Co., Ltd.)
Measurement temperature range: from −10° C. to 300° C.
Temperature elevation rate: 3° C./minute
Measurement frequency: 1 Hz
Strain ratio: 0.01%±0.0025%

The siloxane-modified polyimide used in the present invention can be prepared by a general method used for producing a polyimide. That is, the siloxane-modified polyimide can be produced from tetracarboxylic acid dianhydride corresponding to recurring structural units and a diamine or diisocyanate corresponding to recurring structural units.

Specifically, the siloxane-modified polyimide can be produced by reacting a tetracarboxylic acid dianhydride, a compound having the above formula (3) or (3A) and a siloxane compound of the following formula (5).

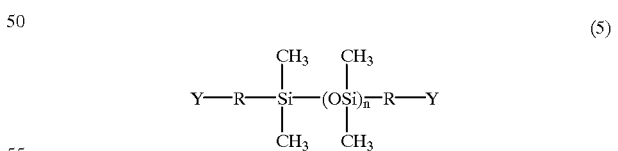

wherein R is as defined in the above formula (2b) and Y is an amino group or an isocynato group.

The tetracarboxylic acid dianhydride includes pyromellitic acid dianhydride, 3,3',4,4'-diphenylsulfonetetracarboxylic acid dianhydride, 3,3',4,4'-benzophenonetetracarboxylic acid dianhydride, 3,3',4,4'-biphenyltetracarboxylic acid dianhydride, 2,3',3,4'-biphenyltetracarboxylic acid dianhydride, bis(3,4-dicarboxyphenyl)ether dianhydride, 4,4'-bis(3,4-dicarboxyphenoxy)diphenylsulfone dianhydride, ethylene glycol bistreimellitate dianhydride and 2,2-bis[4-(3,4-dicarboxyphenoxy)phenyl]propane dianhydride. Preferred are 3,3',4,4'-diphenylsulfonetetracarboxylic acid dianhydride, 3,3',4,4'-biphenyltetracarboxylic acid dianhydride and 2,3',3,4'-biphenyltetracarboxylic acid dianhydride.

In the siloxane compound of the formula (5) used as a material for the preparation of the polyimide, diamines of the formula (5) in which the functional group Y is an amino group include bis(3-aminopropyl)tetramethyldisiloxane, bis(10-aminodecamethylene)tetramethyldisiloxane, dimethylsiloxane tetramer or octamer having an aminopropyl terminal group, and bis (3-aminophenoxymethyl) tetramethyldisiloxane. These siloxane compounds may be used alone or in combination.

In the siloxane compound of the formula (5), isocyanates of the formula (5) in which the functional group Y is an isocyanato group include those formed by replacing "amino" of the above diamines with "isocyanato".

In the siloxane compound of the above formula (5), isocyanates of the formula (5) in which the functional group Y is an isocyanate group can be easily prepared by reacting the corresponding diamines described above as examples with phosgene according to a conventional method.

When the component (b) is a compound of the formula (1), preferably, the siloxane-modified polyimide contains 90 to 40 mol % of at least one of structural units of the formula (2a) and 10 to 60 mol % of at least one of structural units of the formula (2b). When the component (b) is a compound of the formula (1A), preferably, the siloxane-modified polyimide contains 90 to 40 mol % of at least one of structural units of the formula (2a') and 10 to 60 mol % of at least one of structural units of the formula (2b'). More specific examples of the diamines which can constitute Ar in the formula (2a) or (2a') are as follows.

1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, bis[4-(3-aminophenoxy)phenyl]sulfone, bis[4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3-aminophenoxy)phenyl]hexafluoropropane, 2,2-bis[4-(4-aminophenoxy)phenyl]hexafluoropropane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetrabutoxydiphenylmethane, and 4,47-diamino-3,3'-dimethoxydiphenylmethane.

The siloxane-modified polyimide used in the present invention can be prepared by the following method.

When tetracarboxylic acid dianhydride and diamine (including the siloxane compound) are used as raw materials, the siloxane-modified polyimide can be produced by any one of a method in which the above materials are heated up to 100° C. or higher, preferably 180° C. or higher, in an organic solvent optionally in the presence of a catalyst (in an amount of 20 parts by weight or less based on the reactants) such as tributylamine, triethylamine or triphenyl phosphite to directly obtain a polyimide, a method in which tetracarboxylic acid and a diamine are allowed to react in an organic solvent at a temperature of 100° C. or lower to obtain a polyamic acid as a polyimide precursor, a dehydrating catalyst (in an amount of 1 to 5 mol per mole of the tetracarboxylic acid dianhydride) such as p-toluenesulfonic acid is added as required and the mixture is heated to form a polyimide, and a method in which a dehydrating and ring-closing agent (in an amount of 2 to 10 mol per mole of the tetracarboxylic acid dianhydride) selected from acid anhydrides such as acetic acid anhydride, propionic acid anhydride and benzoic acid anhydride or carbodiimide compounds such as dicyclohexylcarbodiimide and optionally a ring-closing catalyst (in an amount of 2 to 10 mol per mole of the tetracarboxlyic acid dianhydride) such as pyridine, isoquinoline, imidazole or triethylamine are added to the above polyamic acid and the polyamic acid is ring-closed at a relatively low temperature (approximately between room temperature and 100° C.).

The organic solvents used for the above reactions include aprotic polar solvents such as N-methyl-2-pyrrolidone, N,N-dimethylacetamide, N,N-dimethylformamide, dimethylsulfoxide, sulfolane, hexamethylphosphoric acid triamide and 1,3-dimethyl-2-imidazolidone, and phenol-containing solvents such as phenol, cresol, xylenol and p-chlorophenol. Further, as required, the above organic solvent may be used as a mixture with benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichlene or nitrobenzene.

When tetracarboxylic acid dianhydride and diisocynate are used as raw materials, the siloxane-modified polyimide can be obtained according to the above method where a polyimdie is directly obtained. In this case, the reaction temperature is preferably room temperature or higher, particularly preferably 60° C. or higher. The tetracarboxylic acid and either the diamine or the diisocynate are allowed to react in equimolar amounts, whereby a polyimide having a high polymerization degree can be obtained. As required, an excess of one material may be used to produce a polyimide so long as the amount of the material does not exceed by 10 mol %.

The compound containing at least 2 methylallyl groups or the compound containing 3 allyl or methylallyl groups as component (B), represented by the formula (1) or (IA), improves the heat resistance and the dielectric constant property of the cured resin composition. The it above compounds are commercially easily available. Further, they can be also synthesized by a conventional method.

The compound containing at least 2 maleimide groups as a component (c) is not specially limited, while compounds of the following formulae (4-1) to (4-5) are particularly preferred in view of electric reliability and solubility in a solvent. These compounds are generally commercially available. Further, they can be also synthesized by a conventional method.

Formulae (4-1) – (4-5)

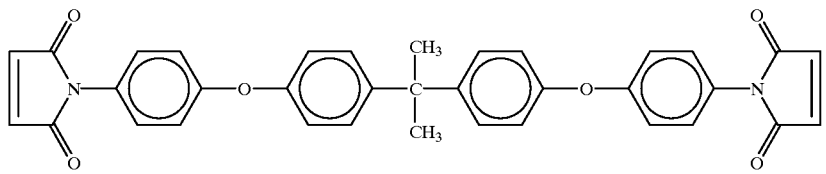

(4-1)

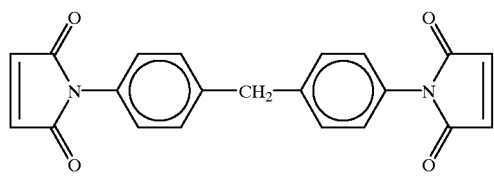

(4-2)

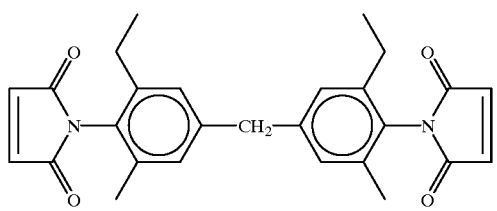

(4-3)

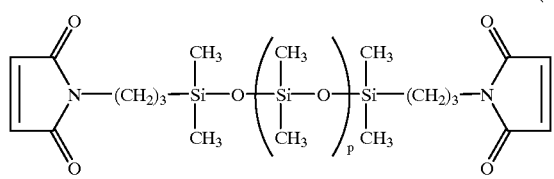

(4-4)

wherein p is an integer of 0 to 8.

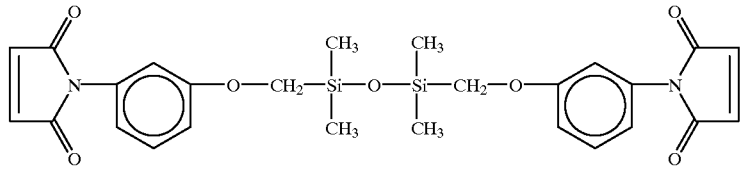

(4-5)

In the amount ratio of the above components in the thermosetting low-dielectric resin composition, the total content of the components (b) and (c) per 100 parts by weight of the component (a) is 10 to 900 parts by weight, preferably 50 to 900 parts by weight, more preferably 100 to 900 parts by weight. When the total content of the components (b) and (c) is smaller than the above lower limit, the resin composition after cured shows a decrease in heat resistance, particularly, a great decrease in Tg and Young's modulus, so that the resin composition is not suitable for the intended use.

Further, the amount ratio of the components (b) and (c) is preferably set such that the amount of allyl groups or methylallyl groups of the component (B) per mole equivalent of maleimide groups of the component (c) is 0.1 to 2.0 mol equivalents. The amount of allyl groups or methylallyl groups of the component (B) per mole equivalent of maleimide groups of the component (c) is more preferably 0.3 to 1.8 mol equivalents, still more preferably 0.5 to 1.5 mol equivalents. When the equivalent weight of the allyl group or the methylally groups is smaller than the above lower limit, the cured resin composition shows poor electric reliability. When the above equivalent weight is greater than the above upper limit, gelation takes place when the components were mixed, and an adhesive can be no longer prepared.

The components (a), (b) and (c) can be mixed in a solvent in which the components are soluble. The solvent includes N-methyl-2-pyrrolidone, N,N-dimethylacetamide, N,N-dimethylformamide, dimethylsulfoxide, sulfolane, hexamethylphosphoric acid triamide, 1,3-dimethyl-2-imidazolidone, hexane, benzene, toluene, xylene, methyl ethyl ketone, acetone, diethyl ether, tetrahydrofuran, dioxane, 1,2-dimethoxymethane, diethylene glycol dimethyl ether, methyl cellosolve, cellosolve acetate, methanol, ethanol, propanol, isopropanol, methyl acetate, ethyl acetate, acetonitrile, methylene chloride, chloroform, carbon tetrachloride, chlorobenzene, dichlorobenzene, dichloroethane and trichloroethane. These solvents are used as required in kinds and amounts suitable for dissolving each components.

The thermosetting low-dielectric resin composition may contain a reaction promoter as required for promoting a reaction during drying or curing under heat. The reaction promoter includes diazabicylcooctane, organic peroxides such as methyl ethyl ketone peroxide, cyclohexane peroxide, 3,3,5-trimethylcyclohexanone peroxide, methylcyclohexanone peroxide, methyl acetoacetate peroxide, acetyl acetone peroxide, 1,1-bis(t-butylperoxy)-3,3,5-trimethylhexane, 1,1-bis(t-butylperoxy)-cyclohexane, 2,2-bis(t-butylperoxy)octane, n-butyl-4,4-bis(t-butylperoxy) valerate, 2,2-bis(t-butylperoxy)butane, t-butyl hydroperoxide, cumene hydroperoxide, diisopropylbenzene hydroperoxide, p-menthane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, α,α'-bis(t-butylperoxy-m-isopropyl)benzene, 2,5-dimethyl-2,5-di(t-butylperoxy)hexane, 2,5-dimethyl-2,5-di(t-butylperoxy) hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, diisopropylperoxydicarbonate, di-2-ethylhexylperoxydicarbonate, di-n-propylperoxydicarbonate, bis(4-t-butylcyclohexyl) peroxydicarbonate, dimyristylperoxydicarbonate, di-2-ethoxyethylperoxydicarbonate, dimethoxyisopropylperoxydicarbonate, di(3-methyl-3-methoxybutyl)peroxydicarbonate, diallylperoxydicarbonate, t-butylperoxyacetate, t-butylperoxyisobutyrate, t-butylperoxypivalate, t-butylperoxyneodecanoate, cumylperoxyneodecanoate, t-butylperoxy-2-ethylhexanoate, t-butylperoxy-3,5,5-trimethylhexanoate, t-butylperoxylaurate, t-butylperoxybenzoate, di-t-butylperoxyisophthalate, 2,5-dimethyl-2,5-di(benzoylperoxy)hexane, t-butylperoxymaleate, t-butylperoxyisopropylcarbonate, cumylperoxyoctate, t-hexylperoxyneodecanoate, t-hexylperoxypivalate, t-butylperoxyneohexanoate, acetylcyclohexylsulfonyl peroxide and t-butylperoxyallylcarbonate, imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-benzyl-2-phenylimidazole-trimellitate, 1-benzyl-2-ethylimidazole, 1-benzyl-2-ethyl-5-methylimidazole, 2-ethylimidazole, 2-isopropylimidazole, 2-phenyl-4-benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimidazole, 1-cyanoethyl-2-methylimidazolium trimellitate, 1-cyanoethyl-2-phenylimidazolium trimellitate, 2,4,-diamino-6-[2'-methylimidazolyl(1')]-ethyl-s-triazine,2,4-diamino-6-[2'-ethyl-4-methylimidazolyl-(1')]-ethyl-s-triazine, 2,4-diamino-6-[2'-undecylimidazolyl-(1')]-ethyl-s-triazine, 2-methylimidazolium isocyanuric acid adduct, 2-phenylimidazolium isocyanuric acid adduct, 2,4-diamino-6-[2'-methylimidazolyl-(1')]-ethyl-s-triazine-isocyanuric acid adduct, 2-phenyl-4,5-dihydroxymethylimidazole, 2-phenyl-4-benzyl-5-hydroxymethylimidazole, 4,4'-methylene-bis-(2-ethyl-5-methylimidazole), 1-aminoethyl-2-methylimidazole, 1-cyanoethyl-2-phenyl-4,5-di(cyanoethoxymethyl)imidazole, 1-dodecyl-2-methyl-3-benzylimidazolium chloride, 2-methylimidazole-benzotriazole adduct, 1-aminoethyl-2-ethylimidazole, 1-(cyanoethylaminoethyl)-2-methylimidazole, N,N'-[2-methylimidazolyl-(1)-ethyl]-adipoyldiamide, N,N'-bis-(2-methylimidazolyl-1-ethyl)urea, N-(2-methylimidazolyl-1-ethyl)urea, N,N'-[2-methylimidazolyl-(1)-ethyl] dodecanedioyldiamide, N,N'-[2-methylimidazolyl-(1)-ethyl]eicosanedioyldiamide and 1-benzyl-2-phenylimidazole-hydrochloride, and triphenyl phosphine.

Further, the thermosetting low-dielectric resin composition may contain a filler having an average particle diameter of 1 μm or less for stabilizing the fluidity of the resin composition when the resin composition is applied to a laminated board or a metal-clad laminate. The content of the filler based on the total solid content is 5 to 70% by weight, preferably 10 to 60% by weight, more preferably 20 to 50% by weight. When the above content is smaller than the above lower limit, the effect on fluidity stabilization is small. When it exceeds the above upper limit, the laminated board shows a decreased adhesion strength and has an increased dielectric constant. The filler is selected, for example, from silica, powdered quartz, alumina, calcium carbonate, magnesium oxide, a diamond powder, mica, a fluorine resin, a zircon powder.

The laminated board and the metal-clad laminate to which the above thermosetting low-dielectric resin composition is applied, provided by the present invention, will be explained below.

A laminated board of one or more prepreg sheets in a semi-cured state, the prepreg being formed of a reinforcing fiber material impregnated with the above resin composition, can be prepared by applying a varnish prepared by dissolving the thermosetting low-dielectric resin composition in the above organic solvent to the reinforcing fiber material such as a woven fabric or non-woven fabric, or impregnating the reinforcing fiber material with the composition, drying the composition and laminating the prepreg sheet(s). In this case, the amount of the resin composition after drying is preferably such an amount that voids of a fabric (cloth) can be fully filled. The thickness of the fabric is 0.05 to 1 mm, preferably 0.1 to 0.5 mm, more preferably 0.1 to 0.2 mm. When the above thickness is too small, the fabric has no sufficient strength. When it is too large, it is difficult to apply the resin composition varnish to the fabric or impregnate the fabric with the resin composition varnish.

The material for the reinforcing fiber material is preferably a heat-resistant fiber. Specifically, the above material includes a carbon fiber, a glass fiber, an aramid fiber, an aromatic polyester fiber, a boron fiber, a silica fiber and a tetrafluorocarbon fiber. These fibers may be long fibers, or they may be short fibers. A woven fabric or a non-woven fabric may be used. These reinforcing materials may be used alone or in combination. It is particularly preferred to use an aramid fiber, an aromatic polyester fiber or a tetrafluorocarbon fiber.

The laminated board formed of prepreg sheet(s) prepared by applying the resin composition varnish to a fabric or impregnating a fabric with the resin composition varnish may be surface-smoothened with a hot laminator or a calender.

According to the present invention, there is provided a metal-clad laminate comprising the above laminated board, which is a laminate formed of a reinforcing fiber material and at least one prepreg sheet filled with the above thermosetting low-dielectric resin composition and is in a semi-cured state, and a metal foil or foils which is or are stacked on and integrated with one surface or both surfaces of the laminated board. The resin of the metal-clad laminate obtained by the above laminating and integration is in a semi-cured state or a cured state. The metal-clad laminate can be formed by attaching a metal foil or foils on one surface or both surfaces of the laminated board in a semi-cured state and integrating them with a press machine, a vacuum press machine or a hot laminator. The metal foil is generally selected from 5 μm to 200 μm thick foils of copper, cupro-nickel, silver, iron, 42 alloy and stainless steel.

A protective film may be formed on a resin surface of the laminated board or one-side metal-clad laminate. The protective film includes a polypropylene film, a fluorine resin-based film, a polyethylene film, a polyethylene terephthalate film and paper. These films may be provided with peeling properties with a silicone resin as required.

The above peeling-off protective film preferably has a 90° peel strength of 0.01 to 7.0 g/cm. When the above peel strength is smaller than the above lower limit, there is a problem that the peeling-off protective film is easily peeled off during the transportation of the laminated board or the one-side metal-clad laminate. When the above peel strength is greater than the above upper limit, the peeling-off protective film is not cleanly peeled off and causes poor workability.

Having excellent flexibility, the thermosetting low-dielectric resin composition of the present invention can be used as a film-like adhesive or a sheet-like adhesive.

According to the present invention, further, there is provided a circuit laminate material formed on a peel-off film or a metal foil and the above thermosetting low-dielectric resin composition laminated on one surface thereof as an adhesive.

The adhesive film and the resin-applied metal sheet of the present invention can be produced by applying the above resin composition to one or both surfaces of a metal foil or to one surface of a peeling-off film and drying the resin composition. In this case, the thickness of a coating formed of the resin composition is 5 to 100 $\mu$m, preferably 10 to 70 $\mu$m. The metal foil is selected from foils which have a thickness of 10 to 200 $\mu$m, preferably 100 $\mu$m or lass, particularly preferably 36 $\mu$m or less and are formed of copper, cupro-nickel, silver, iron, 42 alloy and stainless steel. When the above thickness is too large, it is difficult to form a fine circuit, so that the thickness in the above range is preferred.

The peeling-off film for use in the adhesive film of the present invention is selected from peeling-off films having a thickness of 1 to 200 $\mu$m, preferably 10 to 100 $\mu$m, and it works as a temporary support. The peeling-off film includes a polypropylene film, a fluorine resin-based film, a polyethylene film, a polyethylene terephthalate film and paper. These films may be provided with peeling properties with a silicone resin as required.

The above peeling-off film preferably has a 90° peel strength of 0.01 to 7.0 g/cm for the same reason as that described concerning the above peeling-off film. In the resin-applied metal foil having an adhesive layer formed by application of the above resin composition on one or both surfaces of a metal foil, a peeling-off protective film may be provided on the adhesive layer. The protective film can be selected from the above peeling-off films.

As described above, the present invention provides a resin composition which can be suitably used as a laminate material for a printed circuit board, etc., since it has a low dielectric constant and excellent heat resistance and has a sufficient peel strength at room temperature, a laminated board to which the above resin composition is applied, and a metal-clad laminate to which the above laminated board is applied.

Further, the present invention provides a circuit laminate material which has a low dielectric constant and excellent heat resistance and has a sufficient peel strength at room temperature, and which is free from breaking and scattering of a resin in the vicinity of a cut portion during cutting and therefore has excellent handling properties. The circuit laminate material of the present invention is suitable for use in a printed circuit board.

The present invention will be explained more in detail with reference to Examples hereinafter.

EXAMPLES

Synthesis of Siloxane-modified Polyimide

Synthesis Example 1

29.42 Grams (72 mmol) of 2,2-bis[4-(4-aminophenoxy)phenyl]propane, 6.96 g (28 mmol) of diaminosiloxane represented by the above formula (5) in which Y=NH$_2$, R=propyl and n=1, 35.83 g (100 mol) of 3,3',4,4'-diphenylsulfotetracarboxylic acid dianhydride and 300 ml of N-methyl-2-pyrrolidone (to be referred to as "NMP" hereinafter) were incorporated under a temperature of ice and stirred continuously for 1 hour. Then, the resultant solution allowed to react at room temperature for 2 hours to synthesize a polyamic acid. To the obtained polyamic acid were added 50 ml of toluene and 1.0 g of p-toluenesulfonic acid, and the mixture was heated to 160° C. While water azeotropically boiling with toluene was separated, an imidation was carried out for 3 hours. Then, toluene was distilled off, and the resultant siloxane-modified polyimide varnish was poured into methanol to form a precipitate, followed by the steps of separating, pulverizing, washing and drying the precipitate, to give 61.9 g (yield 94%) of siloxane-modified polyimide containing structural units of the above formulae (2a) and (2b) in a (2a):(2b) molar ratio of 72:28 and having a molecular weight of 18,000, a Tg of 30° C. and dielectric constant of 2.8.

The obtained siloxane-modified polyimide was measured for infrared absorption spectrum to show typical imide absorptions at 1,718 cm$^{-1}$ and 1,783 cm$^{-1}$.

Synthesis Example 2

30.39 Grams (74 mmol) of 2,2-bis[4-( 4-aminophenoxy)phenyl]propane, 19.94 g (26 mmol) of diaminosiloxane represented by the above formula (5) in which Y=NH$_2$, R=propyl and n=8, 29.42 g (100 mol) of 3,3',4,4'-biphenyltetracarboxylic acid dianhydride and 300 ml of NMP were used, and procedures in Synthesis Example 1 were repeated, to give 72.3 g (yield 95%) of siloxane-modified polyimide containing structural units of the formulae (2a) and (2b) in a (2a):(2b) molar ratio of 74:26 and having a molecular weight of 19,000, a Tg of 45° C. and dielectric constant of 2.9.

The obtained siloxane-modified polyimide was measured for infrared absorption spectrum to show typical imide absorptions at 1,718 cm$^{-1}$ and 1,783 cm$^{-1}$.

Synthesis Example 3

41.48 Grams (80 mmol) of 2,2-bis[4-(4-aminophenoxy)phenyl]propane, 15.54 g (20 mmol) of diaminosiloxane represented by the above formula (5) in which Y=NH$_2$, R=propyl and n=8, 29.42 g (100 mol) of 2,3',3,4'-biphenyltetracarboxylic acid dianhydride and 300 ml of NMP were used, and procedures in Synthesis Example 1 were repeated, to give 81.2 g (yield 94%) of siloxane-modified polyimide containing structural units of the formulae (2a) and (2b) in a (2a):(2b) molar ratio of 80:20 and having a molecular weight of 10,000, a Tg of 60° C. and dielectric constant of 2.9.

The obtained siloxane-modified polyimide was measured for infrared absorption spectrum to show typical imide absorptions at 1,718 cm$^{-1}$ and 1,783 cm$^{-1}$.

Preparation of Thermosetting Low-dielectric Resin Composition

Resin Composition Preparation Example 1

100 Parts by weight of the siloxane-modified polyimide obtained in Synthesis Example 3, 272 parts by weight of the compound of the formula (4-2) and 128 parts by weight of the compound of the formula (1) (methylallyl groups had a mole equivalent of 0.5 per mole equivalent of maleimide groups) were added to tetrahydrofuran, and fully mixed and dissolved, to give a resin composition varnish having a solid content of 30% by weight.

Resin Composition Preparation Example 2

A resin composition varnish was obtained in the same manner as in Resin Composition Preparation Example 1 except that the amount of the compound of the formula (4-2) was changed to 206 parts by weight and that the amount of the compound of the formula (1) was changed to 193 parts by weight (methylallyl groups had a mole equivalent of 1.0 per mole equivalent of maleimide groups).

Resin Composition Preparation Example 3

A resin composition varnish was obtained in the same manner as in Resin Composition Preparation Example 1 except that the amount of the compound of the formula (4-2) was changed to 166 parts by weight and that the amount of the compound of the formula (1) was changed to 234 parts by weight (methylallyl groups had a mole equivalent of 1.5 per mole equivalent of maleimide groups).

Resin Composition Preparation Example 4

A resin composition varnish was obtained in the same manner as in Resin Composition Preparation Example 1 except that the amount of the compound of the formula (4-2) was changed to 52 parts by weight and that the amount of the compound of the formula (1) was changed to 49 parts by weight (methylallyl groups had a mole equivalent of 1.0 per mole equivalent of maleimide groups).

Resin Composition Preparation Example 5

A resin composition varnish was obtained in the same manner as in Resin Composition Preparation Example 1 except that the amount of the compound of the formula (4-2) was changed to 464 parts by weight and that the amount of the compound of the formula (1) was changed to 435 parts by weight (methylallyl groups had a mole equivalent of 1.0 per mole equivalent of maleimide groups).

Resin Composition Preparation Example 6

A resin composition varnish was obtained in the same manner as in Resin Composition Preparation Example 1 except that 272 parts by weight of the compound of the formula (4-2) was replaced with 251 parts by weight of the compound of the formula (4-1) and that the amount of the compound of the formula (1) was changed from 128 parts by weight to 148 parts by weight (methylallyl groups had a mole equivalent of 1.0 per mole equivalent of maleimide groups).

Resin Composition Preparation Example 7

A resin composition varnish was obtained in the same manner as in Resin Composition Preparation Example 1 except that 272 parts by weight of the compound of the formula (4-2) was replaced with 228 parts by weight of the compound of the formula (4-3) and that the amount of the compound of the formula (1) was changed from 128 parts by weight to 173 parts by weight (methylallyl groups had a mole equivalent of 1.0 per mole equivalent of maleimide groups).

Resin Composition Preparation Example 8

A resin composition varnish was obtained in the same manner as in Resin Composition Preparation Example 1 except that 272 parts by weight of the compound of the formula (4-2) was replaced with 218 parts by weight of a compound of the formula (4-4) in which p was zero (0) and that the amount of the compound of the formula (1) was changed from 128 parts by weight to 180 parts by weight (methylallyl groups had a mole equivalent of 1.0 per mole equivalent of maleimide groups).

Resin Composition Preparation Example 9

A resin composition varnish was obtained in the same manner as in Resin Composition Preparation Example 1 except that 272 parts by weight of the compound of the formula (4-2) was replaced with 266 parts by weight of a compound of the formula (4-4) in which p was 4 and that the amount of the compound of the formula (1) was changed from 128 parts by weight to 134 parts by weight (methylallyl groups had a mole equivalent of 1.0 per mole equivalent of maleimide groups).

Resin Composition Preparation Example 10

A resin composition varnish was obtained in the same manner as in Resin Composition Preparation Example 1 except that 272 parts by weight of the compound of the formula (4-2) was replaced with 298 parts by weight of a compound of the formula (4-4) in which p was 8 and that the amount of the compound of the formula (1) was changed from 128 parts by weight to 104 parts by weight (methylallyl groups had a mole equivalent of 1.0 per mole equivalent of maleimide groups).

Resin Composition Preparation Example 11

A resin composition varnish was obtained in the same manner as in Resin Composition Preparation Example 1 except that 272 parts by weight of the compound of the formula (4-2) was replaced with 247 parts by weight of the compound of the formula (4-5) and that the amount of the compound of the formula (1) was changed from 128 parts by weight to 155 parts by weight (methylallyl groups had a mole equivalent of 1.0 per mole equivalent of maleimide groups).

Resin Composition Preparation Example 12

A resin composition varnish was obtained in the same manner as in Resin Composition Preparation Example 2 except that the siloxane-modified polyimide obtained in Synthesis Example 3 was replaced with the siloxane-modified polyimide obtained in Synthesis Example 1.

Resin Composition Preparation Example 13

A resin composition varnish was obtained in the same manner as in Resin Composition Preparation Example 2 except that the siloxane-modified polyimide obtained in Synthesis Example 3 was replaced with the siloxane-modified polyimide obtained in Synthesis Example 2.

Resin Composition Preparation Example 14

A resin composition varnish was obtained by dispersing 150 parts by weight of a silica filler in the same resin composition varnish as that obtained in Resin Composition Preparation Example 2.

Resin Composition Preparation Example 15

A resin composition varnish was obtained by dispersing 300 parts by weight of a silica filler in the same resin composition varnish as that obtained in Resin Composition Preparation Example 2.

Resin Composition Preparation Example 16

100 Parts by weight of the siloxane-modified polyimide resin obtained in Synthesis Example 3, 314 parts by weight of the compound of the formula (4-2) and 86 parts by weight of the compound of the formula (1A) in which R was methyl (methylallyl groups had a mole equivalent of 0.5 per mole equivalent of maleimide groups) were added to tetrahydrofuran and these components were fully mixed and dissolved, to give a resin composition varnish having a solid content of 30% by weight.

Resin Composition Preparation Example 17

A resin composition varnish was obtained in the same manner as in Resin Composition Preparation Example 16 except that the amount of the compound of the formula (4-2) was changed to 259 parts by weight and that the amount of the compound of the formula (1A) in which R was methyl was changed to 141 parts by weight (methylallyl groups had a mole equivalent of 1.0 per mole equivalent of maleimide groups).

Resin Composition Preparation Example 18

A resin composition varnish was obtained in the same manner as in Resin Composition Preparation Example 16 except that the amount of the compound of the formula (4-2) was changed to 221 parts by weight and that the amount of the compound of the formula (1A) in which R was methyl was changed to 179 parts by weight (methylallyl groups had a mole equivalent of 1.5 per mole equivalent of maleimide groups).

Resin Composition Preparation Example 19

A resin composition varnish was obtained in the same manner as in Resin Composition Preparation Example 16 except that the amount of the compound of the formula (4-2) was changed to 64 parts by weight and that the amount of the compound of the formula (1A) in which R was methyl was changed to 36 parts by weight (methylallyl groups had a mole equivalent of 1.0 per mole equivalent of maleimide groups).

Resin Composition Preparation Example 20

A resin composition varnish was obtained in the same manner as in Resin Composition Preparation Example 16 except that the amount of the compound of the formula (4-2) was changed to 584 parts by weight and that the amount of the compound of the formula (1A) in which R was methyl was changed to 316 parts by weight (methylallyl groups had a mole equivalent of 1.0 per mole equivalent of maleimide groups).

Resin Composition Preparation Example 21

A resin composition varnish was obtained in the same manner as in Resin Composition Preparation Example 16 except that 314 parts by weight of the compound of the formula (4-2) was replaced with 298 parts by weight of the compound of the formula (4-1) and that the amount of the compound of the formula (1A) in which R was methyl was changed from 86 parts by weight to 102 parts by weight (methylallyl groups had a mole equivalent of 1.0 per mole equivalent of maleimide groups).

Resin Composition Preparation Example 22

A resin composition varnish was obtained in the same manner as in Resin Composition Preparation Example 16 except that 314 parts by weight of the compound of the formula (4-2) was replaced with 278 parts by weight of the compound of the formula (4-3) and that the amount of the compound of the formula (1A) in which R was methyl was changed from 86 parts by weight to 122 parts by weight (methylallyl groups had a mole equivalent of 1.0 per mole equivalent of maleimide groups).

Resin Composition Preparation Example 23

A resin composition varnish was obtained in the same manner as in Resin Composition Preparation Example 16 except that 314 parts by weight of the compound of the formula (4-2) was replaced with 271 parts by weight of the compound of the formula (4-4) in which p was zero (0) and that the amount of the compound of the formula (1A) in which R was methyl was changed from 86 parts by weight to 129 parts by weight (methylallyl groups had a mole equivalent of 1.0 per mole equivalent of maleimide groups).

Resin Composition Preparation Example 24

A resin composition varnish was obtained in the same manner as in Resin Composition Preparation Example 16 except that 314 parts by weight of the compound of the formula (4-2) was replaced with 309 parts by weight of the compound of the formula (4-4) in which p was 4 and that the amount of the compound of the formula (1A) in which R was methyl was changed from 86 parts by weight to 90 parts by weight (methylallyl groups had a mole equivalent of 1.0 per mole equivalent of maleimide groups).

Resin Composition Preparation Example 25

A resin composition varnish was obtained in the same manner as in Resin Composition Preparation Example 16 except that 314 parts by weight of the compound of the formula (4-2) was replaced with 333 parts by weight of the compound of the formula (4-4) in which p was 8 and that the amount of the compound of the formula (1A) in which R was methyl was changed from 86 parts by weight to 67 parts by weight (methylallyl groups had a mole equivalent of 1.0 per mole equivalent of maleimide groups).

Resin Composition Preparation Example 26

A resin composition varnish was obtained in the same manner as in Resin Composition Preparation Example 16 except that 314 parts by weight of the compound of the formula (4-2) was replaced with 294 parts by weight of the compound of the formula (4-5) and that the amount of the compound of the formula (1A) in which R was methyl was changed from 86 parts by weight to 106 parts by weight (methylallyl groups had a mole equivalent of 1.0 per mole equivalent of maleimide groups).

Resin Composition Preparation Example 27

A resin composition varnish was obtained in the same manner as in Resin Composition Preparation Example 17 except that the siloxane-modified polyimide obtained in Synthesis Example 3 was replaced with the same siloxane-modified polyimide as that obtained in Synthesis Example 1.

Resin Composition Preparation Example 28

A resin composition varnish was obtained in the same manner as in Resin Composition Preparation Example 17 except that the siloxane-modified polyimide obtained in Synthesis Example 3 was replaced with the same siloxane-modified polyimide as that obtained in Synthesis Example 2.

Resin Composition Preparation Example 29

A resin composition varnish was obtained by dispersing 150 parts by weight of a silica filler in the same resin composition varnish as that obtained in Resin Composition Preparation Example 17.

Resin Composition Preparation Example 30

A resin composition varnish was obtained by dispersing 300 parts by weight of a silica filler in the same resin composition varnish as that obtained in Resin Composition Preparation Example 17.

Resin Composition Preparation Example 31

100 Parts by weight of the siloxane-modified polyimide resin obtained in Synthesis Example 3, 325 parts by weight of the compound of the formula (4-2) and 75 parts by weight of the compound of the formula (1A) in which R was hydrogen (allyl groups had a mole equivalent of 0.5 per mole equivalent of maleimide groups) were added to tetrahydrofuran and these components were fully mixed and dissolved, to give a resin composition varnish having a solid content of 30% by weight.

Resin Composition Preparation Example 32

A resin composition varnish was obtained in the same manner as in Resin Composition Preparation Example 31 except that the amount of the compound of the formula (4-2) was changed to 273 parts by weight and that the amount of the compound of the formula (1A) in which R was hydrogen was changed to 127 parts by weight (allyl groups had a mole equivalent of 1.0 per mole equivalent of maleimide groups).

Resin Composition Preparation Example 33

A resin composition varnish was obtained in the same manner as in Resin Composition Preparation Example 31 except that the amount of the compound of the formula (4-2) was changed to 236 parts by weight and that the amount of the compound of the formula (1A) in which R was hydrogen was changed to 164 parts by weight (allyl groups had a mole equivalent of 1.5 per mole equivalent of maleimide groups).

Resin Composition Preparation Example 34

A resin composition varnish was obtained in the same manner as in Resin Composition Preparation Example 31 except that the amount of the compound of the formula (4-2) was changed to 68 parts by weight and that the amount of the compound of the formula (1A) in which R was hydrogen was changed to 32 parts by weight (allyl groups had a mole equivalent of 1.0 per mole equivalent of maleimide groups).

Resin Composition Preparation Example 35

A resin composition varnish was obtained in the same manner as in Resin Composition Preparation Example 31 except that the amount of the compound of the formula (4-2) was changed to 615 parts by weight and that the amount of the compound of the formula (1A) in which R was hydrogen was changed to 285 parts by weight (allyl groups had a mole equivalent of 1.0 per mole equivalent of maleimide groups).

Resin Composition Preparation Example 36

A resin composition varnish was obtained in the same manner as in Resin Composition Preparation Example 31 except that 325 parts by weight of the compound of the formula (4-2) was replaced with 310 parts by weight of the compound of the formula (4-1) and that the amount of the compound of the formula (1A) in which R was hydrogen was changed from 75 parts by weight to 90 parts by weight (allyl groups had a mole equivalent of 1.0 per mole equivalent of maleimide groups).

Resin Composition Preparation Example 37

A resin composition varnish was obtained in the same manner as in Resin Composition Preparation Example 31 except that 325 parts by weight of the compound of the formula (4-2) was replaced with 291 parts by weight of the compound of the formula (4-3) and that the amount of the compound of the formula (1A) in which R was hydrogen was changed from 75 parts by weight to 109 parts by weight (allyl groups had a mole equivalent of 1.0 per mole equivalent of maleimide groups).

Resin Composition Preparation Example 38

A resin composition varnish was obtained in the same manner as in Resin Composition Preparation Example 31 except that 325 parts by weight of the compound of the formula (4-2) was replaced with 284 parts by weight of the compound of the formula (4-4) in which p was 0 (zero) and that the amount of the compound of the formula (1) in which R was hydrogen was changed from 75 parts by weight to 105 parts by weight (allyl groups had a mole equivalent of 1.0 per mole equivalent of maleimide groups).

Resin Composition Preparation Example 39

A resin composition varnish was obtained in the same manner as in Resin Composition Preparation Example 31 except that 325 parts by weight of the compound of the formula (4-2) was replaced with 320 parts by weight of the compound of the formula (4-4) in which p was 4 and that the amount of the compound of the formula (1) in which R was hydrogen was changed from 75 parts by weight to 80 parts by weight (allyl groups had a mole equivalent of 1.0 per mole equivalent of maleimide groups).

Resin Composition Preparation Example 40

A resin composition varnish was obtained in the same manner as in Resin Composition Preparation Example 31 except that 325 parts by weight of the compound of the formula (4-2) was replaced with 341 parts by weight of the compound of the formula (4-4) in which p was 8 and that the amount of the compound of the formula (1A) in which R was hydrogen was changed from 75 parts by weight to 59 parts by weight (allyl groups had a mole equivalent of 1.0 per mole equivalent of maleimide groups).

Resin Composition Preparation Example 41

A resin composition varnish was obtained in the same manner as in Resin Composition Preparation Example 31 except that 325 parts by weight of the compound of the formula (4-2) was replaced with 305 parts by weight of the compound of the formula (4-5) and that the amount of the compound of the formula (1A) in which R was hydrogen was changed from 75 parts by weight to 94 parts by weight (allyl groups had a mole equivalent of 1.0 per mole equivalent of maleimide groups).

Resin Composition Preparation Example 42

A resin composition varnish was obtained in the same manner as in Resin Composition Preparation Example 32 except that the siloxane-modified polyimide obtained in Synthesis Example 3 was replaced with the same siloxane-modified polyimide as that obtained in Synthesis Example 1.

Resin Composition Preparation Example 43

A resin composition varnish was obtained in the same manner as in Resin Composition Preparation Example 32 except that the siloxane-modified polyimide obtained in Synthesis Example 3 was replaced with the same siloxane-modified polyimide as that obtained in Synthesis Example 2.

Resin Composition Preparation Example 44

A resin composition varnish was obtained by dispersing 150 parts by weight of a silica filler in the same resin composition varnish as that obtained in Resin Composition Preparation Example 32.

Resin Composition Preparation Example 45

A resin composition varnish was obtained by dispersing 300 parts by weight of a silica filler in the same resin composition varnish as that obtained in Resin Composition Preparation Example 32.

EXAMPLES

Examples 1–15

100 Parts by weight of an aromatic polyester non-woven fabric (thickness 0.1 mm, supplied by Kuraray Ltd.) was impregnated with 120 parts by weight, as a solid content, of each of the resin composition varnishes obtained in Resin Composition Preparation Examples 1 to 15, each impregnated non-woven fabric was dried in a hot air circulating dryer at 140° C. for 5 minutes to obtain prepregs. The prepregs were tack-free and flexible so that they were excellent in workability. Four sheets of each prepreg were independently stacked one on another, and 18 $\mu$m thick copper foils were placed on the outermost surfaces of each laminate, one copper foil on one surface and the other copper foil on the other surface. The resultant sets were shaped under a pressure of 20 kg/cm$^2$ under heating conditions of 200° C. and 2 hours, to give double-side copper-clad laminates having a thickness of 0.4 mm each. The laminates were measured or tested as will be described later. Table 1 shows the results.

Example 16

A double-side copper clad laminate having a thickness of 0.4 mm was obtained in the same manner as in Examples 1 to 15 except that the resin composition varnish obtained in Resin Composition Preparation Example 2 was used and that the aromatic polyester non-woven fabric was replaced with an aramid non-woven fabric (thickness 0.1 mm, supplied by E. I. du Pont de Nemours & Co.). The laminate was measured or tested as will be described later. Table 1 shows the results.

Example 17

A double-side copper clad laminate having a thickness of 0.4 mm was obtained in the same manner as in Examples 1 to 15 except that the resin composition varnish obtained in Resin Composition Preparation Example 2 was used and that the aromatic polyester non-woven fabric was replaced with a tetrafluorocarbon non-woven fabric (thickness 0.1 mm, supplied by Tomoegawa). The laminate was measured or tested as will be described later. Table 1 shows the results.

Example 18

A double-side copper clad laminate having a thickness of 0.4 mm was obtained in the same manner as in Examples 1 to 15 except that the resin composition varnish obtained in Resin Composition Preparation Example 2 was used and that the 18 $\mu$m thick copper foils were replaced with 18 $\mu$m thick 42 alloy foils. The laminate was measured or tested as will be described later. Table 1 shows the results.

Comparative Example 1

100 Parts by weight of the same siloxane-modified polyimide resin as that obtained in Synthesis Example 3 and 400 parts by weight of the compound of the formula (4-2) were added to tetrahydrofuan and fully mixed and dissolved to obtain a resin composition having a solid content of 30% by weight. Then, the resin composition was used to prepare a double-side copper-clad laminate having a thickness of 0.4 mm in the same manner as in Examples 1 to 15. The laminate was measured or tested as will be described later. Table 1 shows the results.

Comparative Example 2

A resin composition varnish was obtained in the same manner as in Resin Composition Preparation Example 1 except that the siloxane-modified polyimide obtained in Synthesis Example 3 was replaced with an acrylonitrile-butadiene copolymer. Then, the resin composition varnish was used to prepare a double-side copper-clad laminate having a thickness of 0.4 mm in the same manner as in Examples 1 to 15. The laminate was measured or tested as will be described later. Table 1 shows the results.

TABLE 1

| | Properties | | | |
|---|---|---|---|---|
| | Dielectric constant | Peel strength | Heat resistance against soldering | PCBT |
| Ex. 1 | 3.0 | 1.2 kg/cm | No problem | No short circuit |
| Ex. 2 | 2.9 | 1.2 kg/cm | No problem | No short circuit |
| Ex. 3 | 3.0 | 1.3 kg/cm | No problem | No short circuit |
| Ex. 4 | 3.0 | 1.3 kg/cm | No problem | No short circuit |
| Ex. 5 | 3.0 | 1.2 kg/cm | No problem | No short circuit |
| Ex. 6 | 3.0 | 1.4 kg/cm | No problem | No short circuit |
| Ex. 7 | 2.9 | 1.3 kg/cm | No problem | No short circuit |
| Ex. 8 | 2.8 | 1.2 kg/cm | No problem | No short circuit |
| Ex. 9 | 2.9 | 1.3 kg/cm | No problem | No short circuit |
| Ex. 10 | 3.0 | 1.2 kg/cm | No problem | No short circuit |
| Ex. 11 | 2.9 | 1.2 kg/cm | No problem | No short circuit |
| Ex. 12 | 2.8 | 1.4 kg/cm | No problem | No short circuit |
| Ex. 13 | 2.9 | 1.4 kg/cm | No problein | No short circuit |
| Ex. 14 | 3.0 | 1.3 kg/cm | No problem | No short circuit |
| Ex. 15 | 3.0 | 1.2 kg/cm | No problem | No short circuit |
| Ex. 16 | 2.9 | 1.3 kg/cm | No problem | No short circuit |
| Ex. 17 | 2.9 | 1.4 kg/cm | No problem | No short circuit |
| Ex. 18 | 3.0 | 1.2 kg/cm | No problem | No short circuit |
| CEx. 1 | 3.3 | 1.4 kg/cm | Copper foil swollen | No short circuit |
| CEx. 2 | 3.5 | 1.2 kg/cm | No problem | No short circuit |

Ex. = Example, CEx. = Comparative Example (Evaluation methods)

Dielectric constant: A capacitance was measured at a frequency of 1 MHz according to JIS C6481 (specific dielectric constant and dielectric tangent), to determine a dielectric constant.

Peel strength: Measured according to JIS C6481 (peel strength).

Heat resistance against soldering: Measured according to JIS C6481 (heat resistance against soldering), and an appearance was studied for a problem.

PCBT (Pressure Cooker Bias Test): A pattern having a line-line distance of 100 μm was formed on the laminate surface by etching, a 0.1 mm thick prepreg sheet was laminated on the pattern, and the resultant set was shaped under a pressure of 20 kg/cm$^2$ under heat at a temperature of 200° C. for 2 hours to obtain a test sample. The test sample was studied for a short circuit between lines under conditions of an applied voltage of 5 V, 121° C., 2 atmospheric pressures, 100% RH and 1,000 hours.

Examples 19–48

100 Parts by weight of an aromatic polyester non-woven fabric (thickness 0.1 mm, supplied by Kuraray Ltd.) was impregnated with 120 parts by weight, as a solid content, of each of the resin composition varnishes obtained in Resin Composition Preparation Examples 16 to 45, each impregnated non-woven fabric was dried in a hot air circulating dryer at 140° C. for 5 minutes to obtain prepregs. The prepregs were tack-free and flexible so that they were excellent in workability. Four sheets of the each prepreg were independently stacked one on another, and 18 μm thick copper foils were placed on the outermost surfaces of each laminate, one copper foil on one surface and the other copper foil on the other surface. The resultant sets were respectively shaped under a pressure of 20 kg/cm$^2$ under heating conditions of 200° C. and 2 hours, to give double-side copper-clad laminates having a thickness of 0.4 mm each. The laminates were measured or tested in the same manner as in Examples 1 to 18. Table 2 shows the results.

Example 49

A double-side copper clad laminate having a thickness of 0.4 mm was obtained in the same manner as in Examples 19 to 48 except that the aromatic polyester non-woven fabric was replaced with an aramid non-woven fabric (thickness 0.1 mm, supplied by E. I. du Pont de Nemours & Co.). The laminate was measured or tested in the same manner as in Examples 1 to 18. Table 2 shows the results.

Example 50

A double-side copper clad laminate having a thickness of 0.4 mm was obtained in the same manner as in Examples 19 to 48 except that the aromatic polyester non-woven fabric was replaced with a tetrafluorocarbon non-woven fabric (thickness 0.1 mm, supplied by Tomoegawa). The laminate was measured or tested in the same manner as in Examples 1 to 18. Table 2 shows the results.

Example 51

A double-side copper clad laminate having a thickness of 0.4 mm was obtained in the same manner as in Examples 19 to 48 except that the 18 μm thick copper foils were replaced with 18 μm thick 42 alloy foils. The laminate was measured or tested in the same manner as in Examples 1 to 18. Table 2 shows the results.

Comparative Example 3

100 Parts by weight of the same siloxane-modified polyimide resin as that obtained in Synthesis Example 3 and 400 parts by weight of the compound of the formula (4-2) were added to tetrahydrofuan and fully mixed and dissolved to obtain a resin composition having a solid content of 30% by weight. Then, the resin composition was used to prepare a double-side copper-clad laminate having a thickness of 0.4 mm in the same manner as in Examples 19 to 48. The laminate was measured or tested in the same manner as in Examples 1 to 18. Table 2 shows the results.

Comparative Example 4

A resin composition varnish was obtained in the same manner as in Resin Composition Preparation Example 16 except that the siloxane-modified polyimide obtained in Synthesis Example 3 was replaced with an acrylonitrile-butadiene copolymer. Then, the resin composition varnish was used to prepare a double-side copper-clad laminate having a thickness of 0.4 mm in the same manner as in Examples 19 to 48. The laminate was measured or tested in the same manner as in Examples 1 to 18. Table 2 shows the results.

TABLE 2

| | Properties | | | |
| --- | --- | --- | --- | --- |
| | Dielectric constant | Peel strength | Heat resistance against soldering | PCBT |
| Ex. 19 | 3.0 | 1.2 kg/cm | No problem | No short circuit |
| Ex. 20 | 2.9 | 1.2 kg/cm | No problem | No short circuit |
| Ex. 21 | 3.0 | 1.3 kg/cm | No problem | No short circuit |
| Ex. 22 | 3.0 | 1.3 kg/cm | No problem | No short circuit |
| Ex. 23 | 3.0 | 1.2 kg/cm | No problem | No short circuit |
| Ex. 24 | 3.0 | 1.4 kg/cm | No problem | No short circuit |
| Ex. 25 | 2.9 | 1.3 kg/cm | No problem | No short circuit |
| Ex. 26 | 2.8 | 1.2 kg/cm | No problem | No short circuit |
| Ex. 27 | 2.9 | 1.3 kg/cm | No problem | No short circuit |
| Ex. 28 | 3.0 | 1.2 kg/cm | No problem | No short circuit |
| Ex. 29 | 2.9 | 1.2 kg/cm | No problem | No short circuit |
| Ex. 30 | 2.8 | 1.4 kg/cm | No problem | No short circuit |
| Ex. 31 | 2.9 | 1.4 kg/cm | No problem | No short circuit |
| Ex. 32 | 3.0 | 1.3 kg/cm | No problem | No short circuit |
| Ex. 33 | 3.0 | 1.2 kg/cm | No problem | No short citcuit |
| Ex. 34 | 2.9 | 1.3 kg/cm | No problem | No short circuit |
| Ex. 35 | 2.9 | 1.4 kg/cm | No problem | No short circuit |
| Ex. 36 | 3.0 | 1.2 kg/cm | No problem | No short circuit |
| Ex. 37 | 2.9 | 1.2 kg/cm | No problem | No short circuit |
| Ex. 38 | 2.8 | 1.3 kg/cm | No problem | No short circuit |
| Ex. 39 | 2.9 | 1.3 kg/cm | No problem | No short circuit |
| Ex. 40 | 2.9 | 1.2 kg/cm | No problem | No short circuit |
| Ex. 41 | 3.0 | 1.3 kg/cm | No problem | No short circuit |
| Ex. 42 | 2.8 | 1.4 kg/cm | No problem | No short circuit |
| Ex. 43 | 3.0 | 1.2 kg/cm | No problem | No short circuit |
| Ex. 44 | 3.0 | 1.2 kg/cm | No problem | No short circuit |
| Ex. 45 | 2.9 | 1.3 kg/cm | No problem | No short circuit |
| Ex. 46 | 3.0 | 1.2 kg/cm | No problem | No short circuit |
| Ex. 47 | 2.9 | 1.2 kg/cm | No problem | No short circuit |
| Ex. 48 | 3.0 | 1.4 kg/cm | No problem | No short circuit |
| Ex. 49 | 2.8 | 1.2 kg/cm | No problem | No short circuit |
| Ex. 50 | 2.8 | 1.2 kg/cm | No problem | No short circuit |
| Ex. 51 | 3.0 | 1.3 kg/cm | No problem | No short circuit |
| CEx. 3 | 3.3 | 1.4 kg/cm | Copper foil swollen | No short circuit |
| CEx. 4 | 3.5 | 1.1 kg/cm | No problem | No short circuit |

Ex. = Example

Examples 52–66

Each of the resin composition varnishes obtained in Resin Composition Preparation Examples 1 to 15 was applied to one surface of a 18 μm thick copper foil so as to form a dry adhesive layer having a thickness of 60 μm, and the copper foils having the adhesive layer each were dried in a hot air circulating dryer at 140° C. for 5 minutes, to obtain resin-applied copper foils (a circuit laminating material).

Separately, both surfaces of each of the same 0.4 mm thick double-side copper-clad laminates as those obtained in Examples 1 to 15 were etched in portions requiring no copper foil, to obtain inner-layer circuit boards. Then, the above resin-applied copper foils were stacked on the corresponding inner-layer circuit boards such that the resin surface of each resin-applied copper foil was attached to the inner-layer circuit of each, and the resultant sets were shaped under a pressure of 20 kg/cm² under heating conditions of 200° C. for 2 hours, to obtain multi-layered copper-clad laminates. The laminates were measured or tested in the same manner as in Example 1. Further, the resin-applied copper foils in a semi-cured state were punched out with a die, and end surfaces thereof were visually observed to determine "scattering". Table 3 shows the results.

Example 67

An inner-layer-possessing multi-layered copper-clad laminate was obtained in the same manner as in Examples 52 to 66 except that the varnish obtained in Resin Composition Preparation Example 2 was used and that the 18 μm thick copper foil was replaced with a 18 μm thick 42 alloy foil. Table 3 shows the results.

Example 68

The resin composition varnish obtained in Resin Composition Preparation Example 2 was applied to one surface of a 38 μm thick polyethylene terephthalate film treated so as to be peeled off, such that a dry adhesive layer having a thickness of 60 μm was to be formed, and the film having the adhesive layer was dried in a hot air circulating dryer at 140° C. for 5 minutes, to obtain an adhesive film (a circuit laminating material). When the adhesive film was cut with a knife, it was free from cracking and scattering of a resin in the vicinity of cut portions, so that it was excellent in handling properties. Then, a 18 μm thick copper foil was attached to the adhesive surface of the adhesive film, to obtain a resin-applied copper foil. In this manner, a plurality of resin-applied copper foils, which are included in the circuit laminate material of the present invention, were prepared.

Separately, 100 parts by weight of an aromatic polyester non-woven fabric (thickness 0.1 mm, supplied by Kuraray Ltd.) was impregnated with 120 parts by weight, as a solid content, of the resin composition varnish obtained in Resin Composition Preparation Example 2, the impregnated non-woven fabric was dried in a hot air circulating dryer at 140° C. for 5 minutes to obtain prepreg. Four sheets of the prepreg were stacked one on another, and 18 μm thick copper foils were placed on the outermost surfaces of the laminate, one copper foil on one surface and the other copper foil on the other surface. The resultant set was shaped under a pressure of 20 kg/cm² under heating conditions of 200° C., to give a double-side copper-clad laminate having a thickness of 0.4 mm. Further, surfaces of the double-side copper-clad laminate were etched in portions requiring no copper foil, to obtain an inner-layer circuit board. Then, the above resin-applied copper foils were stacked on both the surfaces of the inner-layer circuit board such that the resin surface of each resin-applied copper foil was attached to each inner-layer circuit. Then, the polyethylene terephthalate films treated so as to be peeled off were peeled off, and then 18 μm thick copper foils were stacked on the outermost surfaces, and the resultant set was shaped under a pressure of 20 kg/cm² under heating conditions of 200° C. for 2 hours, to obtain a multi-layered copper-clad laminate. The laminate was measured or tested in the same manner as in Example 52. Table 3 shows the results.

Comparative Example 5

100 Parts by weight of the same siloxane-modified polyimide resin as that obtained in Synthesis Example 3 and 400 parts by weight of the compound of the formula (4-2) were added to tetrahydrofuan and fully mixed and dissolved to obtain a resin composition having a solid content of 30% by weight. Then, the resin composition was used to prepare an inner-layer-circuit-possessing copper-clad laminate in the same manner as in Examples 52 to 66. The laminate was measured or tested in the same manner as in Example 52. Table 3 shows the results.

Comparative Example 6

179 Parts by weight of the compound of the formula (4-2) and 168 parts by weight of the compound of the formula (1) (methylallyl groups had a mole equivalent of 1.0 per mole equivalent of maleimide groups) were added to tetrahydrofuan and fully mixed and dissolved to obtain a resin composition having a solid content of 30% by weight. Then, the resin composition was used to prepare an inner-layer-circuit-possessing copper-clad laminate in the same manner as in Examples 52 to 66. The laminate was measured or tested in the same manner as in Example 52. Table 3 shows the results.

Comparative Example 7

A resin composition varnish was obtained in the same manner as in Resin Composition Preparation Example 1 except that the siloxane-modified polyimide obtained in Synthesis Example 3 was replaced with an acrylonitrile-butadiene copolymer. Then, the resin composition varnish was used to prepare an inner-layer-circuit-possessing copper-clad laminate in the same manner as in Examples 52 to 66. The laminate was measured or tested in the same manner as in Example 52. Table 3 shows the results.

TABLE 3

| | Properties | | | | |
|---|---|---|---|---|---|
| | Dielectric constant | Peel strength | Heat resistance against soldering | Scattering | PCBT |
| Ex. 52 | 3.0 | 1.2 kg/cm | No problem | No burr | No short circuit |
| Ex. 53 | 2.9 | 1.2 kg/cm | No problem | No burr | No short circuit |
| Ex. 54 | 3.0 | 1.3 kg/cm | No problem | No burr | No short circuit |
| Ex. 55 | 3.0 | 1.3 kg/cm | No problem | No burr | No short circuit |
| Ex. 56 | 3.0 | 1.2 kg/cm | No problem | No burr | No short circuit |
| Ex. 57 | 3.0 | 1.4 kg/cm | No problem | No burr | No short circuit |
| Ex. 58 | 2.9 | 1.3 kg/cm | No problem | No burr | No short circuit |
| Ex. 59 | 2.8 | 1.2 kg/cm | No problem | No burr | No short circuit |
| Ex. 60 | 2.9 | 1.3 kg/cm | No problem | No burr | No short circuit |
| Ex. 61 | 3.0 | 1.2 kg/cm | No problem | No burr | No short circuit |
| Ex. 62 | 2.9 | 1.2 kg/cm | No problem | No burr | No short circuit |
| Ex. 63 | 2.8 | 1.4 kg/cm | No problem | No burr | No short circuit |
| Ex. 64 | 2.9 | 1.4 kg/cm | No problem | No burr | No short circuit |

TABLE 3-continued

| | | | Properties | | |
|---|---|---|---|---|---|
| | Dielectric constant | Peel strength | Heat resistance against soldering | Scattering | PCBT |
| Ex. 65 | 3.0 | 1.3 kg/cm | No problem | No burr | No short circuit |
| Ex. 66 | 3.0 | 1.2 kg/cm | No problem | No burr | No short circuit |
| Ex. 67 | 2.9 | 1.2 kg/cm | No problem | No burr | No short circuit |
| Ex. 68 | 3.0 | 1.2 kg/cm | No problem | No burr | No short circuit |
| CEx. 5 | 3.3 | 1.4 kg/cm | Copper foil swollen | No burr | No short circuit |
| CEx. 6 | 2.8 | 1.3 kg/cm | No problem | Burr | No short circuit |
| CEx. 7 | 3.5 | 1.2 kg/cm | No problem | No burr | No short circuit |

Ex. = Example, CEx. = Comparative Example

Scattering: A resin-applied copper foil in a semi-cured state was punched out with a die, and end surfaces thereof were visually observed.

Examples 69–83

In each of Examples 69 to 83, one of the same resin composition varnishes as those obtained in Resin Composition Preparation Examples 16 to 30 was applied to one surface of a 18 μm thick copper foil so as to form a dry adhesive layer having a thickness of 60 μm, and in each of Examples 84 to 87, one of the same resin composition varnishes as those obtained in Resin Composition Preparation Examples 34 to 37 was applied to one surface of a 18 μm thick copper foil so as to form a dry adhesive layer having a thickness of 60 μm. The copper foils having the adhesive layer each were dried in a hot air circulating dryer at 140° C. for 5 minutes, to obtain resin-applied copper foils which are included in the circuit laminate material of the present invention. When the resin-applied copper foils were cut with a knife, they was free from cracking and scattering of a resin in the vicinity of cut portions, so that they were excellent in handling properties.

In each Example, separately, 100 parts by weight of an aromatic polyester non-woven fabric (thickness 0.1 mm, supplied by Kuraray Ltd.) was impregnated with 120 parts by weight, as a solid content, of the resin composition varnish obtained in one of the above Resin Composition Preparation Examples, the impregnated non-woven fabric was dried in a hot air circulating dryer at 140° C. for 5 minutes to obtain prepreg. Four sheets of the prepreg were stacked one on another, and 18 μm thick copper foils were placed on the outermost surfaces of the laminate, one copper foil on one surface and the other copper foil on the other surface. The resultant set was shaped under a pressure of 20 kg/cm² under heating conditions of 200° C., to give a double-side copper-clad laminate having a thickness of 0.4 mm. Further, surfaces of the double-side copper-clad laminate were etched in portions requiring no copper foil, to obtain an inner-layer circuit board.

In each Example, then, the above resin-applied copper foils were stacked on both the surfaces of the inner-layer circuit board such that the resin surface of each resin-applied copper foil was attached to each inner-layer circuit. Then, the resultant set was shaped under a pressure of 20 kg/cm² under heating conditions of 200° C. for 2 hours, to obtain an inner-layer-circuit-possessing multi-layered copper-clad laminate. The so-obtained laminates were measured or tested in the same manner as in Example 52. Table 4 shows the results.

Example 88

An inner-layer-possessing multi-layered metal-clad laminate was obtained in the same manner as in Example 70 except that the resin varnish obtained in Resin Composition Preparation Example 17 was used and that the 18 μm thick copper foils were replaced with 18 μm thick 42 alloy foils. The laminate was measured or tested in the same manner as in Example 52. Table 4 shows the results.

Example 89

The resin composition varnish obtained in Resin Composition Preparation Example 17 was applied to one surface of a 38 μm thick polyethylene terephthalate film treated so as to be peeled off, such that a dry adhesive layer having a thickness of 60 μm was to be formed, and the film having the adhesive layer was dried in a hot air circulating dryer at 140° C. for 5 minutes, to obtain an adhesive film. When the adhesive film was cut with a knife, it was free from cracking and scattering of a resin in the vicinity of cut portions, so that it was excellent in handling properties. Then, a 18 μm thick copper foil was attached to the adhesive surface of the adhesive film, to obtain a resin-applied copper foil which is included in the circuit laminate material of the present invention. In this manner, a plurality of resin-applied copper foils were prepared.

Separately, 100 parts by weight of an aromatic polyester non-woven fabric (thickness 0.1 mm, supplied by Kuraray Ltd.) was impregnated with 120 parts by weight, as a solid content, of the resin composition varnish obtained in Resin Composition Preparation Example 17, the impregnated non-woven fabric was dried in a drying furnace at 140° C. for 5 minutes to obtain prepreg. Four sheets of the prepreg were stacked one on another, and 18 μm thick copper foils were placed on the outermost surfaces of the laminate, one copper foil on one surface and the other copper foil on the other surface. The resultant set was shaped under a pressure of 20 kg/cm² under heating conditions of 200° C., to give a double-side copper-clad laminate having a thickness of 0.4 mm. Further, surfaces of the double-side copper-clad laminate were etched in portions requiring no copper foil, to obtain an inner-layer circuit board.

Then, the above resin-applied copper foils were stacked on both the surfaces of the inner-layer circuit board such that the resin surface of each resin-applied copper foil was attached to inner-layer circuits. Then, the resultant set was shaped under a pressure of 20 kg/cm² under heating conditions of 200° C. for 2 hours, to obtain an inner-layer-circuit-possessing multi-layered copper-clad laminate. The laminate was measured or tested in the same manner as in Example 52. Table 4 shows the results.

Comparative Example 9

100 Parts by weight of the same siloxane-modified polyimide resin as that obtained in Synthesis Example 3 and 400 parts by weight of the compound of the formula (4-2) were added to tetrahydrofuan and fully mixed and dissolved to obtain a resin composition having a solid content of 30% by weight. Then, the resin composition was used to prepare an inner-layer-circuit-possessing copper-clad laminate in the same manner as in Examples 69. The laminate was measured or tested in the same manner as in Example 52. Table 3 shows the results.

Comparative Example 9

179 Parts by weight of the compound of the formula (4-2) and 168 parts by weight of the compound of the formula (1A) in which R was methyl (methylallyl groups had a mole equivalent of 1.0 per mole equivalent of maleimide groups) were added to tetrahydrofuan and fully mixed and dissolved to obtain a resin composition having a solid content of 30% by weight. Then, the resin composition was used to prepare an inner-layer-circuit-possessing copper-clad laminate in the same manner as in Example 69. The laminate was measured or tested in the same manner as in Example 52. Table 4 shows the results.

Comparative Example 10

A resin composition varnish was obtained in the same manner as in Resin Composition Preparation Example 16 except that the siloxane-modified polyimide obtained in Synthesis Example 3 was replaced with an acrylonitrile-butadiene copolymer. Then, the resin composition varnish was used to prepare an inner-layer-circuit-possessing copper-clad laminate in the same manner as in Example 69. The laminate was measured or tested in the same manner as in Example 52. Table 3 shows the results.

TABLE 4

| | Properties | | | | |
|---|---|---|---|---|---|
| | Dielectric constant | Peel strength | Heat resistance against soldering | Scattering | PCBT |
| Ex. 69 | 2.9 | 1.3 kg/cm | No problem | No burr | No short circuit |
| Ex. 70 | 2.8 | 1.2 kg/cm | No problem | No burr | No short circuit |
| Ex. 71 | 2.9 | 1.3 kg/cm | No problem | No burr | No short circuit |
| Ex. 72 | 2.9 | 1.2 kg/cm | No problem | No burr | No short circuit |
| Ex. 73 | 3.0 | 1.2 kg/cm | No problem | No burr | No short circuit |
| Ex. 74 | 3.0 | 1.3 kg/cm | No problem | No burr | No short circuit |
| Ex. 75 | 3.0 | 1.3 kg/cm | No problem | No burr | No short circuit |
| Ex. 76 | 2.8 | 1.3 kg/cm | No problem | No burr | No short circuit |
| Ex. 77 | 2.9 | 1.2 kg/cm | No problem | No burr | No short circuit |
| Ex. 78 | 2.8 | 1.2 kg/cm | No problem | No burr | No short circuit |
| Ex. 79 | 2.9 | 1.2 kg/cm | No problem | No burr | No short circuit |
| Ex. 80 | 2.8 | 1.2 kg/cm | No problem | No burr | No short circuit |
| Ex. 81 | 3.0 | 1.3 kg/cm | No problem | No burr | No short circuit |
| Ex. 82 | 2.9 | 1.3 kg/cm | No problem | No burr | No short circuit |
| Ex. 83 | 2.8 | 1.2 kg/cm | No problem | No burr | No short circuit |
| Ex. 84 | 2.9 | 1.4 kg/cm | No problem | No burr | No short circuit |
| Ex. 85 | 3.0 | 1.4 kg/cm | No problem | No burr | No short circuit |
| Ex. 86 | 3.0 | 1.4 kg/cm | No problem | No burr | No short circuit |
| Ex. 87 | 2.9 | 1.3 kg/cm | No problem | No burr | No short circuit |
| Ex. 88 | 2.9 | 1.2 kg/cm | No problem | No burr | No short circuit |
| Ex. 89 | 2.8 | 1.3 kg/cm | No problem | No burr | No short circuit |
| CEx. 8 | 3.3 | 1.4 kg/cm | Copper foil swollen | No burr | No short circuit |
| CEx. 9 | 2.8 | 1.3 kg/cm | No problem | Burr | No short circuit |
| CEx. 10 | 3.5 | 1.2 kg/cm | No problem | No burr | No short circuit |

Ex. = Example, CEx. = Comparative Example

What is claimed is:

1. A thermosetting resin low-dielectric composition comprising a component (a): siloxane-modified polyimide, component (b): a compound containing 2 methylallyl groups and having the following formula (1) or a compound containing 3 allyl groups or 3 methylallyl groups and having the following formula (1A), and component (c): a compound containing at least 2 maleimide groups

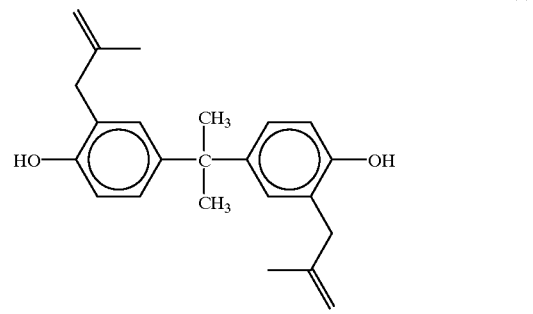

Formula (1)

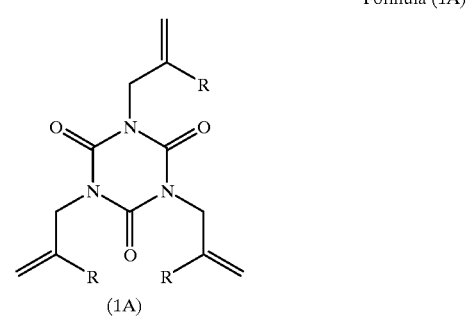

Formula (1A)

wherein R is a hydrogen atom or methyl group.

2. A thermosetting low-dielectric resin composition according to claim 1, wherein the components (b) and (c) has a total content of 10 to 900 parts by weight per 100 parts by weight of the component (a) and methylallyl or allyl groups of the component (b) have a mole equivalent of 0.1 to 2.0 per mole equivalent of maleimide groups of the component (c).

3. A thermosetting low-dielectric resin composition according to claim 1, wherein the siloxane-modified polyimide as a component (a) contains 90 to 40 mol % of at least one of structural units of the following formula (2a) and 10 to 60 mol % of at least one of structural units of the following formula (2b) when the component (b) is the compound of the formula (1).

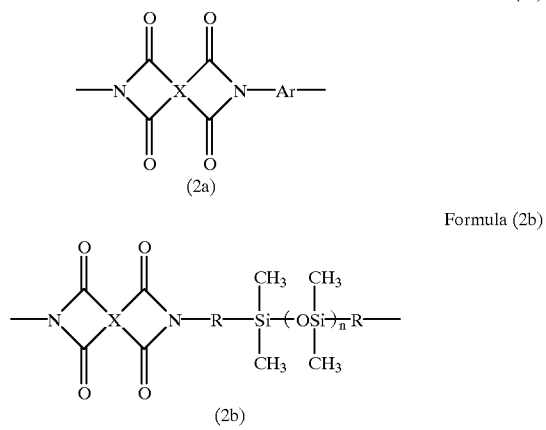

Formula (2a)

(2a)

Formula (2b)

(2b)

wherein X is a tetravalent aromatic group and is any one of a 3,3',4,4'-diphenylsulfone structure, a 3,3',4,4'-biphenyl structure and 2,3',3,4'-biphenyl structure, Ar is a divalent group selected from aromatic-ring-possessing groups of the following formula (3), R is —$CH_2OC_6H_4$— whose methylen group is bonded to Si or an alkylene group having 1 to 10 carbon atoms, and n is an integer of 1 to 20,

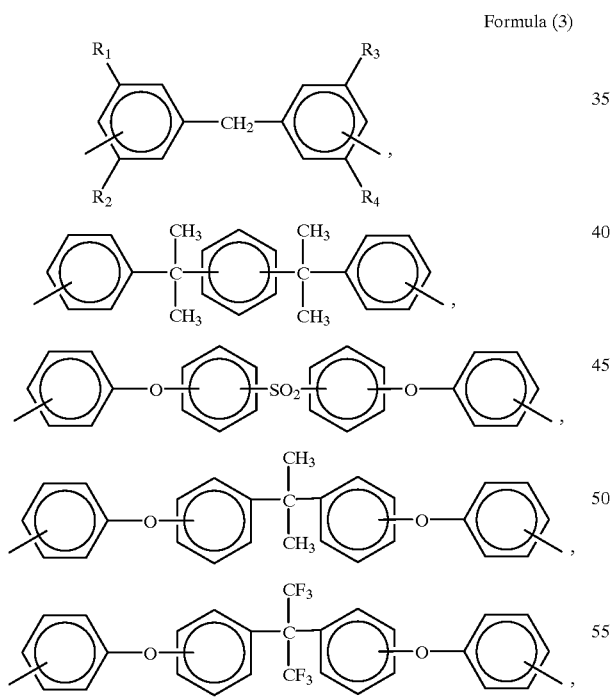

Formula (3)

wherein each of $R_1$, $R_2$, $R_3$ and $R_4$ is independently a hydrogen atom or an alkyl or alkoxy group having 1 to 4 carbon atoms provided that all of these are hydrogen atoms in no case.

4. A thermosetting low-dielectric resin composition according to claim 1, wherein the siloxane-modified polyimide as a component (a) contains 90 to 40 mol % of at least one of structural units of the following formula (2a') and 10 to 60 mol % of structural units of the following formula (2b') when the component (b) has the formula (1A)

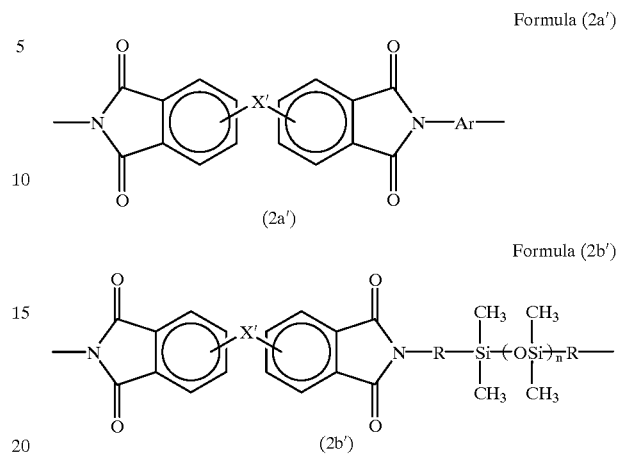

Formula (2a')

(2a')

Formula (2b')

(2b')

wherein X is a direct bond or any one of binding groups of —O—, —$SO_2$—, —CO—, —$C(CH_3)_2$—, —$C(CF_3)_2$— and —$COOCH_2CH_2OCO$—, Ar is a divalent group selected from aromatic-ring-possessing groups of the following formula (3A), R is —$CH_2OC_6H_4$— whose methylen group is bonded to Si or an alkylene group having 1 to 10 carbon atoms, and n is an integer of 1 to 20, Formula (3A)

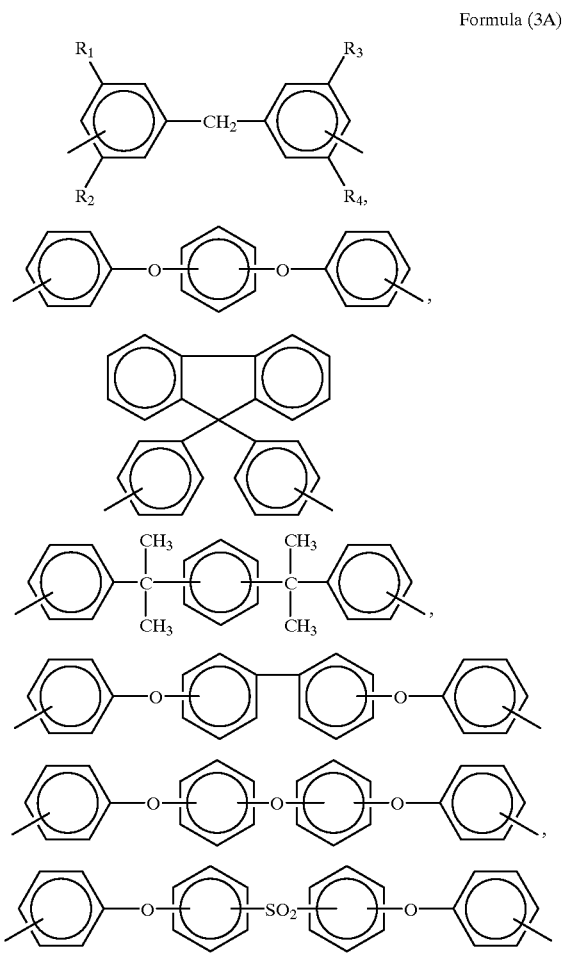

-continued

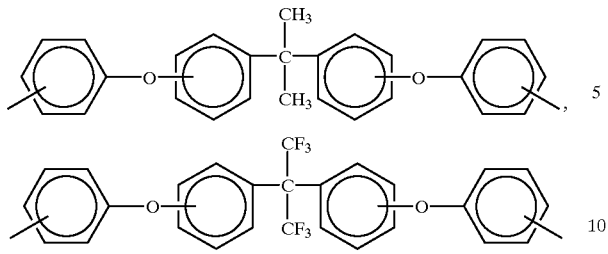

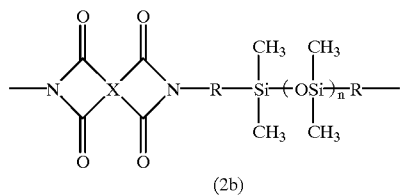

wherein each of R₁, R₂, R₃ and R₄ is independently a hydrogen atom or an alkyl or alkoxy group having 1 to 4 carbon atoms provided that all of these are hydrogen atoms in no case.

5. A thermosetting low-dielectric resin composition includes an embodiment in which the siloxane-modified polyimide as a component (a) contains 90 to 40 mol % of at least one of structural units of the following formula (2a) and 10 to 60 mol % of structural units of the following formula (2b) when the component (b) has the formula (1A)

Formula (2a)

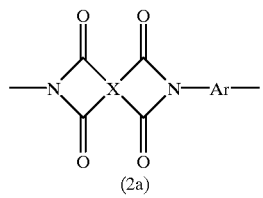

wherein X is a tetravalent aromatic group and is any one of a 3,3',4,4'-diphenylsulfone structure, a 3,3',4,4'-biphenyl structure and 2,3',3,4'-biphenyl structure, Ar is a divalent group selected from aromatic-ring-possessing groups of the following formula (3A) recited claim 4, R is —CH₂OC₆H₄— whose methylen group is bonded to Si or an alkylene group having 1 to 10 carbon atoms, and n is an integer of 1 to 20.

6. A thermosetting low-dielectric resin composition according to claim 1, wherein the siloxane-modified polyimide as component (a) has a dielectric constant of 3.0 or less.

7. A thermosetting low-dielectric resin composition according to claim 1, wherein the siloxane-modified polyimide as component (a) has a glass transition temperature of 150° C. or lower.

8. A thermosetting low-dielectric resin composition according to claim 1, wherein the siloxane-modified polyimide as component (a) has a weight average molecular weight of 5,000 to 500,000.

9. A thermosetting low-dielectric resin composition according to claim 1, wherein the compound containing at least 2 maleimide groups as component (c) is a compound of the formula (4-1) to (4-5):

(4-1)

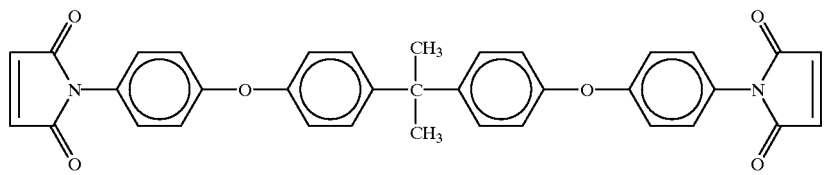

(4-2)

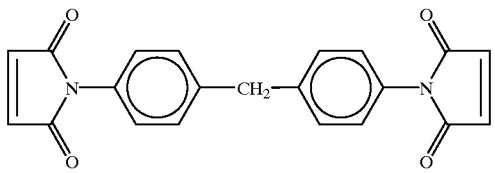

(4-3)

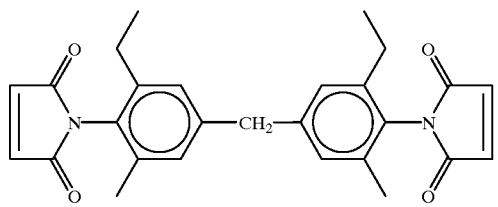

(4-4)

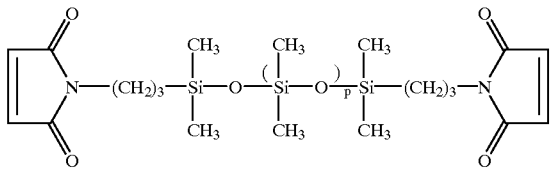

wherein p is an integer of 0 to 8;
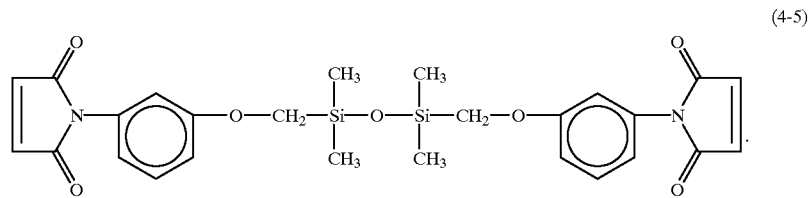
(4-5)
10. A thermosetting low-dielectric resin composition according to claim 1, which contains 5 to 70% by weight, based on the total solid content, of a filler having an average particle diameter of 1 μm or less.
11. A thermosetting low-dielectric resin composition according to claim 1, which has a dielectric constant of 3.2 or less after cured.
* * * * *